US007001801B2

(12) United States Patent
Yamazaki et al.

(10) Patent No.: US 7,001,801 B2
(45) Date of Patent: Feb. 21, 2006

(54) METHOD OF MANUFACTURING SEMICONDUCTOR DEVICE HAVING FIRST AND SECOND INSULATING FILMS

(75) Inventors: Shunpei Yamazaki, Tokyo (JP); Hideomi Suzawa, Kanagawa (JP); Hirokazu Yamagata, Tokyo (JP)

(73) Assignee: Semiconductor Energy Laboratory Co., Ltd., (JP)

( * ) Notice: Subject to any disclaimer, the term of this patent is extended or adjusted under 35 U.S.C. 154(b) by 40 days.

(21) Appl. No.: 10/413,736

(22) Filed: Apr. 15, 2003

(65) Prior Publication Data

US 2003/0201496 A1 Oct. 30, 2003

Related U.S. Application Data

(62) Division of application No. 09/583,678, filed on May 31, 2000, now Pat. No. 6,583,471.

(30) Foreign Application Priority Data

Jun. 2, 1999 (JP) ................................ 11-154432

(51) Int. Cl.
*H01L 21/00* (2006.01)
*H01L 21/84* (2006.01)

(52) U.S. Cl. ...................... 438/149; 438/151; 438/157; 438/159; 438/176; 438/283

(58) Field of Classification Search ................ 438/149, 438/157, 159, 176, 151, 283; 257/347, 59, 257/72
See application file for complete search history.

(56) References Cited

U.S. PATENT DOCUMENTS

| | | | | |
|---|---|---|---|---|
| 5,177,592 | A * | 1/1993 | Takahashi et al. | 257/758 |
| 5,594,569 | A | 1/1997 | Konuma et al. | 349/122 |
| 5,643,826 | A | 7/1997 | Ohtani et al. | 437/88 |
| 5,712,495 | A | 1/1998 | Suzawa | 257/51 |
| 5,717,224 | A | 2/1998 | Zhang | 257/57 |
| 5,923,962 | A | 7/1999 | Ohtani et al. | 349/143 |
| 6,057,904 | A | 5/2000 | Kim et al. | 438/150 |
| 6,088,070 | A | 7/2000 | Ohtani et al. | 349/38 |
| 6,165,824 | A | 12/2000 | Takano et al. | 438/160 |
| 6,271,897 | B1 | 8/2001 | Ichikawa et al. | 349/43 |
| 6,294,799 | B1 | 9/2001 | Yamazaki et al. | 257/72 |
| 6,297,520 | B1 | 10/2001 | Kubo et al. | 257/72 |
| 6,306,694 | B1 | 10/2001 | Yamazaki et al. | 438/151 |
| 6,313,481 | B1 | 11/2001 | Ohtani et al. | 257/59 |

(Continued)

FOREIGN PATENT DOCUMENTS

EP 1 103 946 5/2001

(Continued)

OTHER PUBLICATIONS

Yoshida, T. et al, "A Full-Color Thresholdless Antiferroelectric LCD Exhibiting Wide Viewing Angle with Fast Response Time," SID 97 Digest, pp. 841-844, (1997).

(Continued)

*Primary Examiner*—Thien F. Tran
(74) *Attorney, Agent, or Firm*—Cook, Alex, McFarron, Manzo, Cummings & Mehler, Ltd.

(57) ABSTRACT

In order to increase an aperture ratio, a part of or all of a gate electrode that overlaps with channel formation regions (213, 214) of a pixel TFT is caused to overlap with second wirings (source line or drain line) (154, 157). Additionally, a first interlayer insulating film (149) and a second interlayer insulating film (**150*c*) are disposed between the gate electrode and the second wirings (154, 157**) so as to decrease a parasitic capacitance.

51 Claims, 28 Drawing Sheets

U.S. PATENT DOCUMENTS

| | | | | |
|---|---|---|---|---|
| 6,365,915 | B1 | 4/2002 | Hirai et al. | 257/59 |

FOREIGN PATENT DOCUMENTS

| | | | |
|---|---|---|---|
| JP | 7-130652 | | 5/1995 |
| JP | 09219453 | * | 8/1997 |
| JP | 10-247735 | | 9/1998 |
| JP | 11-097702 | | 4/1999 |
| JP | 11-133463 | | 5/1999 |
| JP | 2000-299469 | | 10/2000 |
| JP | 2000-312007 | | 11/2000 |
| JP | 2001-343933 | | 12/2001 |

OTHER PUBLICATIONS

Furue, H. et al, "Characteristics and Driving Scheme of Polymer-Stabilized Monostable FLCD Exhibiting Fast Response Time and High Contrast Ratio with Gray-Scale Capability," SID 98 Digest, pp. 782-785, (1998).

Shimokawa, R. et al, "Characterization of High-Efficiency Cast-Si Cell Wafers by MBIC Measurement," Japanese Journal of Applied Physics, vol. 27, No. 5, pp. 751-758, May, (1998).

* cited by examiner

METHOD OF MANUFACTURING SEMICONDUCTOR DEVICE HAVING FIRST AND SECOND INSULATING FILMS

This application is a divisional of U.S. application Ser. No. 09/583,678, filed on May 31, 2000 now Pat. No. 6,583,471.

BACKGROUND OF THE INVENTION

1. Field of the Invention

This invention relates to a semiconductor device having circuits formed by thin-film transistors (hereinafter designated as TFT) and relates to a method of manufacturing the semiconductor device. For example, this invention relates to an electrooptical device typified by a liquid crystal display panel and relates to electronic equipment provided with such electrooptical devices as components.

It should be first noted that a semiconductor device described in this specification signifies a general device workable by the use of semiconductor characteristics. In this sense, electrooptical devices, semiconductor circuits, and electronic equipment are all semiconductor devices.

2. Description of the Related Art

Development has advanced in a semiconductor device having large-area integrated circuits that are formed by TFTs on a substrate having an insulating surface. An active matrix type liquid crystal display, an EL display, and a close contact type image sensor are known as typical examples thereof. Specifically, a TFT in which a crystalline silicon film (typically, polysilicon film) is made an active layer (hereinafter, designated as polysilicon TFT) has greater electron field-effect mobility, and therefore, a variety of functional circuits can also be formed.

For example, the active matrix type liquid crystal display includes a pixel circuit for displaying an image for each functional block, a shift register circuit based on a CMOS circuit, a level shifter circuit, a buffer circuit, a driving circuit for controlling the pixel circuit, such as a sampling circuit. These circuits are formed on a single substrate.

The pixel circuit of the active matrix type liquid crystal display has hundreds of thousands to millions of pixels each of which is provided with a TFT, and the TFT has pixel electrodes. An opposite electrode is mounted on the opposite substrate side with a liquid crystal therebetween, thereby forming a kind of capacitor in which the liquid crystals serve as dielectrics. Furthermore, voltage applied to each pixel is controlled by the switching function of the TFT so as to control an electric charge to the capacitor, thereby driving the liquid crystals and controlling the amount of transmitted light. As a result, an image is displayed.

If the pixel circuit and the driving circuit are formed on the insulating surface, capacity (i.e., parasitic capacitance) is inevitably generated between multi-layer wirings to be formed.

The amount of the parasitic capacitance depends on an electrode area where a lower layer wiring and an upper layer wiring overlap, the film thickness of an insulating film between the overlapping lower and upper layer wirings, or other factors.

In recent years, as the reduction in the size and in the power consumption of a circuit advances, the influence of the parasitic capacitance has become too strong to ignore. For this reason, a proposal has been made to enlarge the electrode area of an auxiliary capacity in order to reduce the influence of the parasitic capacitance. However, a problem resides in that the aperture ratio of a pixel region is lessened if the electrode area is enlarged.

Additionally, if the lower layer wiring and the upper layer wiring are constructed not to overlap with each other, then the aperture ratio thereof is lessened similarly.

Especially, in the active matrix type liquid crystal display not more than an inch diagonally in size, the aperture ratio has received the greatest attention.

In order to improve the aperture ratio of the pixel region, attempts are being made. For example, the width of a wiring is narrowed not to enlarge a wiring area, or lower and upper layer wirings are laid on each other to the utmost limit so as to form multi-layer wirings.

In addition, a contact hole that reaches a source region and a drain region also has a reduced minute size by making circuits compact. A way of obtaining good contact connection is to taper the contact hole so as to form a lean. However, the size of the contact hole is increased by tapering it extremely. In a situation in which a microscopic contact hole whose diameter is about 0.5–1.5 $\mu$m, for example, is formed, etching defects, such as over-etching or etching residue, have occurred according to some etching conditions when an interlayer insulating film is thick, because the film thickness of a TFT in a source region or drain region is only 10 nm–50 nm.

The present invention is a technique for solving the aforementioned problems. Furthermore, it is an object of the present invention to reduce parasitic capacitance formed between multi-layer wirings and improve display characteristics in a semiconductor device, and additionally, to provide a manufacturing method for realizing such a semiconductor device.

SUMMARY OF THE INVENTION

A semiconductor device according to an aspect of the present invention disclosed in this specification is characterized in that it comprises a first wiring on an insulating surface, a first interlayer insulating film covering the first wiring, a second interlayer insulating film in contact with a part of the first interlayer insulating film, and a second wiring on the first and second interlayer insulating films, wherein the first and second interlayer insulating films are laminated together in a region where the first and second wirings overlap with each other.

In the aforementioned structure, an etching rate of the first interlayer insulating film is lower than that of the second interlayer insulating film.

Preferably, in the aforementioned structure, a selective ratio of an etching rate of the first interlayer insulating film to the second interlayer insulating film is 1.5 or more.

Additionally, in the aforementioned structure, a film thickness of the first interlayer insulating film is 50–300 nm.

Additionally, in the aforementioned structure, a film thickness of the second interlayer insulating film is 150 nm–1 $\mu$m.

A semiconductor device according to another aspect of the invention including at least a TFT on an insulating surface is characterized in that a first interlayer insulating film, a second interlayer insulating film, and a second wiring are formed above a first wiring forming the TFT, and above a source region and drain region of the TFT, a gate insulating film, a first interlayer insulating film, and a second wiring are formed.

In the aforementioned structure, the sum of a film thickness of the gate insulating film and a film thickness of the first interlayer insulating film is 0.1 $\mu$m or more.

A semiconductor device according to still another aspect of the invention including at least a TFT on an insulating surface is characterized in that, above a first wiring forming the TFT, a second wiring exists via a first interlayer insulating film and second interlayer insulating film.

In the aforementioned structure, the TFT has a source region and a drain region, and the first interlayer insulating film is disposed over the source region or the drain region.

Additionally, in the aforementioned structure, the TFT is a reverse-stagger type TFT.

Additionally, in the aforementioned structure, the first wiring is a gate wiring.

A semiconductor device according to still another aspect of the present invention is characterized in that a semiconductor device including at least a pixel circuit and a driving circuit for controlling the pixel circuit, the circuit and the driving circuit disposed on a same substrate, comprises a pixel TFT forming the pixel circuit, the pixel TFT having a channel formation region, a gate insulating film, a gate wiring, a second wiring, and a plurality of insulating films, each having an etching rate different each other, wherein the channel formation region of the pixel TFT is formed to overlap with a part of the gate wiring with the gate insulating film therebetween, and the part of the gate wiring overlaps with the a second wiring with the plurality of insulating films therebetween.

In the aforementioned structure, the second wiring is a source line or a drain line.

Additionally, in the aforementioned structure, the driving circuit comprises an n-channel type TFT having an LDD region wherein at least a part of or all of the LDD region is formed to overlap with the gate wiring of the n-channel type TFT, and an LDD region of the pixel TFT is formed not to overlap with a gate electrode of the pixel TFT.

Additionally, in the aforementioned structure, at least a part of or all of an LDD region of an n-channel type TFT forming the driving circuit is formed to overlap with a gate electrode of the n-channel type TFT, an LDD region of a pixel TFT forming the pixel circuit is formed not to overlap with a gate electrode of the pixel TFT, and a capacitance storage of the pixel circuit is formed of a shielding film disposed on an organic resin film, an oxide of the shielding film, and a pixel electrode.

A manufacturing method for realizing a semiconductor device constructed as above is characterized in that it comprises a first step of forming a first wiring on an insulating substrate, a second step of forming a first interlayer insulating film covering the first wiring, a third step of forming a second interlayer insulating film on the first interlayer insulating film, a fourth step of selectively removing a part of the second interlayer insulating film, and a fifth step of forming a second wiring on the second interlayer insulating film that overlaps with the first wiring.

A manufacturing method according to another aspect of the present invention is characterized in that a method of manufacturing a semiconductor device including at least a TFT on an insulating surface, comprises a first step of forming an active layer on the insulating surface, a second step of forming a gate insulating film in contact with the active layer, a third step of adding an n-type impurity element or a p-type impurity element to a part of the active layer, thereby forming a source region or a drain region, a fourth step of forming a first interlayer insulating film covering a gate wiring and a gate electrode, a fifth step of forming a second interlayer insulating film on the first interlayer insulating film, a sixth step of etching the second interlayer insulating film, thereby eliminating the second interlayer insulating film disposed over the source region or the drain region, a seventh step of etching the first interlayer insulating film and the gate insulating film, thereby forming a contact hole that reaches the source region or the drain region, and an eighth step of forming a second wiring in contact with the source region or the drain region, the second wiring disposed on the second interlayer insulating film that overlaps with the gate electrode.

A manufacturing method according to still another aspect of the present invention is characterized in that a method of manufacturing a semiconductor device including at least a pixel circuit and driving circuit for controlling the pixel circuit, each disposed on a same substrate, comprises a first step of forming an active layer on an insulating surface, a second step of forming a gate insulating film in contact with the active layer, a third step of forming a gate wiring and a gate electrode on the gate insulating film, a fourth step of adding an n-type impurity element or a p-type impurity element to a part of the active layer, thereby forming an n-type impurity region or a p-type impurity region, a fifth step of forming a first interlayer insulating film covering the gate wiring and the gate electrode, a sixth step of selectively forming a second interlayer insulating film on the first interlayer insulating film that overlaps with the gate electrode, a seventh step of etching the first interlayer insulating film and the gate insulating film, thereby forming a contact hole that reaches the n-type impurity region or the p-type impurity region, and an eighth step of forming a second wiring in contact with the n-type impurity region or the p-type impurity region, the second wiring disposed on the second interlayer insulating film that overlaps with the gate electrode.

A manufacturing method according to still another aspect of the present invention is characterized in that a method of manufacturing a semiconductor device including at least a pixel circuit and driving circuit for controlling the pixel circuit, each disposed on a same substrate, comprises a first step of forming an active layer on an insulating surface, a second step of forming a gate insulating film in contact with the active layer, a third step of forming a gate wiring and a gate electrode on the gate insulating film, a fourth step of adding an n-type impurity element or a p-type impurity element to a part of the active layer, thereby forming an n-type impurity region or a p-type impurity region, a fifth step of forming a first interlayer insulating film covering the gate wiring and the gate electrode, a sixth step of etching the first interlayer insulating film and the gate insulating film, thereby forming a contact hole that reaches the n-type impurity region or the p-type impurity region, a seventh step of selectively forming a second interlayer insulating film on the first interlayer insulating film, and an eighth step of forming a second wiring in contact with the n-type impurity region or the p-type impurity region, the second wiring disposed on the second interlayer insulating film that overlaps with the gate electrode.

By application of the present invention, a parasitic capacitance formed by multi-layer wirings can be decreased, and thereby the performance and reliability of a semiconductor device (herein, specifically, electrooptical device) can be improved greatly.

In addition, in a pixel circuit of an electrooptical device typified by an active matrix type liquid crystal display, the parasitic capacitance can be made sufficiently small in spite of the fact that a gate wiring and a second wiring are caused to overlap with each other, and an aperture ratio is increased. This makes it possible to increase an aperture ratio in an active matrix type liquid crystal display device less than 1 inch diagonally in size, and to decrease the parasitic capacitance, and, additionally, to secure a sufficient capacitance storage. In addition, this brings about improvement of the performance and reliability of a semiconductor device (herein, specifically, electronic equipment) that has such an electrooptical device serving as a display medium.

DETAILED DESCRIPTION OF THE PREFERRED EMBODIMENTS

Figure 5:
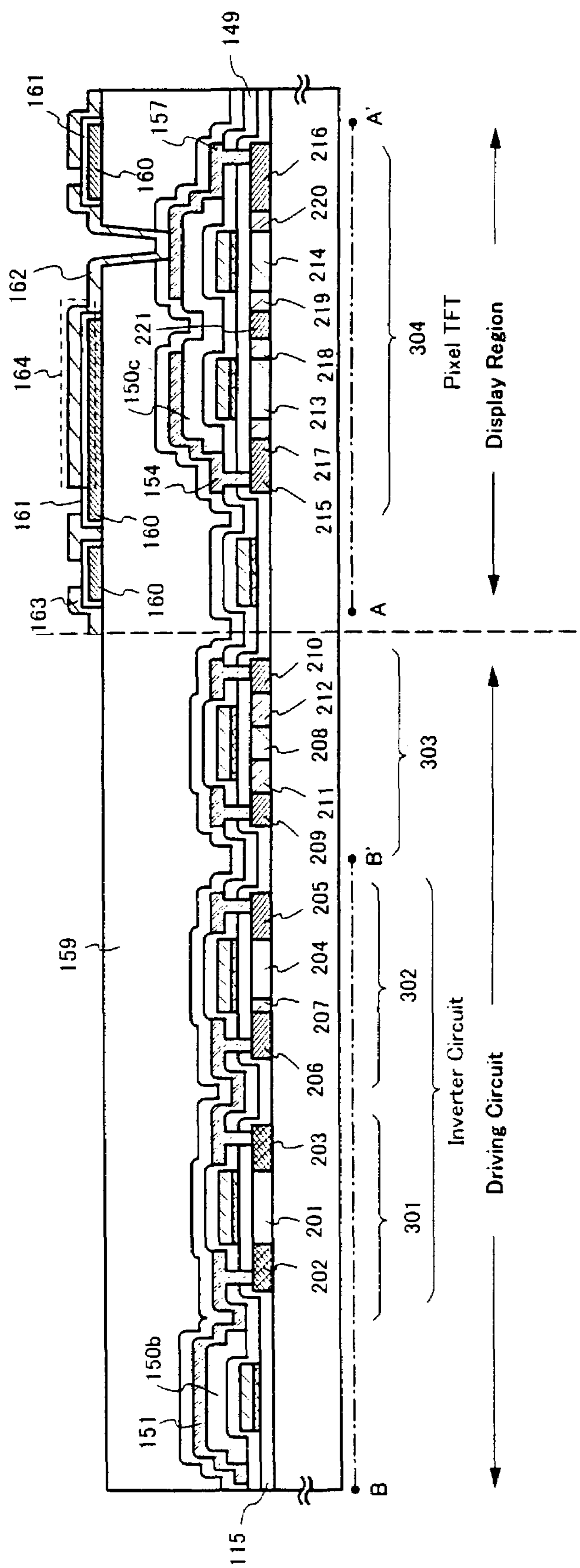
FIG. 5 is a view showing a manufacturing step of the AM-LCD.

Referring to FIG. 5, an embodiment of the present invention will be described hereinafter.

Figure 8A:
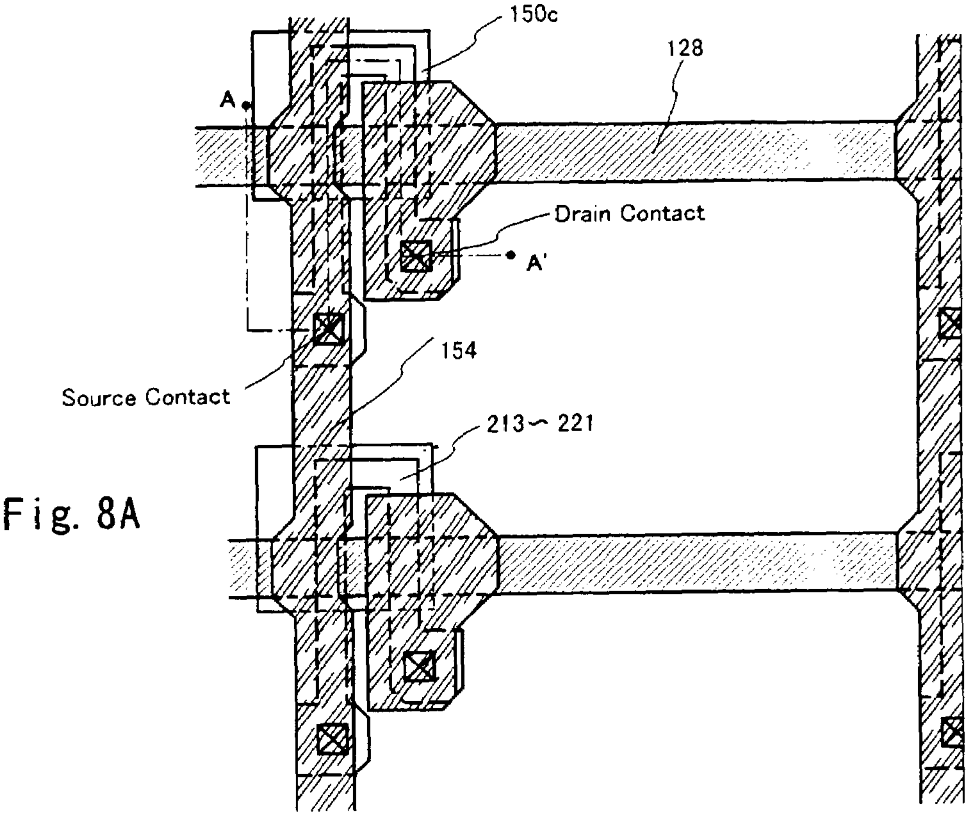
FIGS. 8(A) and 8(B) are top views of a pixel circuit.
Figure 8B:
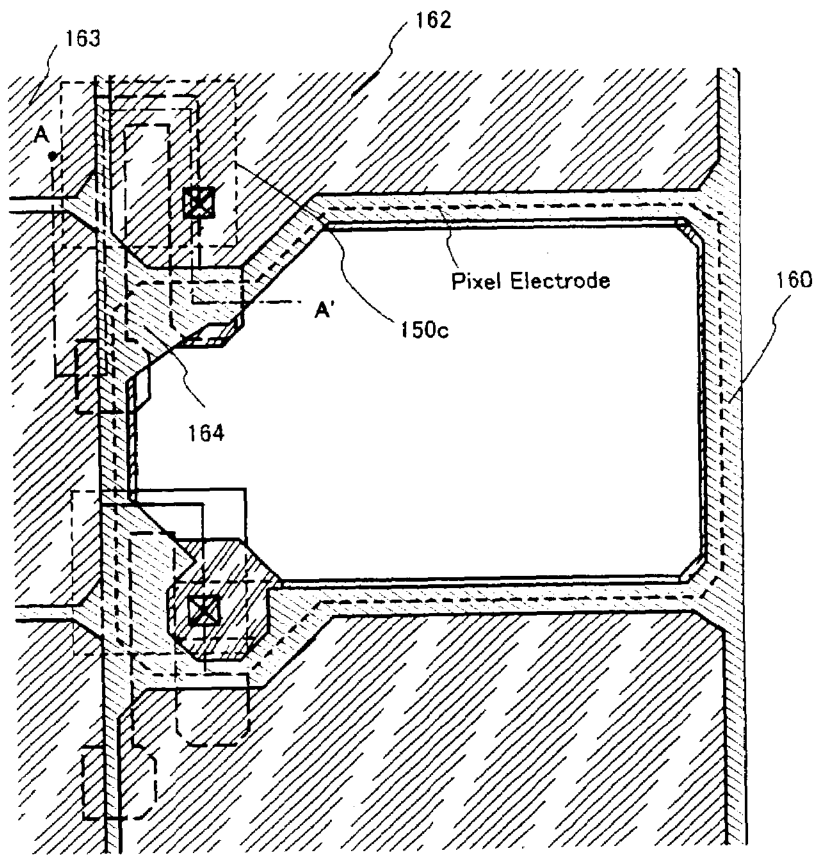

As shown in FIG. 5, in order to improve an aperture ratio, second wirings 154, 157 (source line or drain line) are laid on a part of or all of a gate electrode that overlaps with the channel-forming regions 213, 214 of a pixel TFT, in the present invention. A first interlayer insulating film 149 and a second interlayer insulating film 150*c* are disposed between the gate electrode and the second wirings 154,157 so as to decrease a parasitic capacitance. A top view of a display region corresponding to FIG. 5 is shown in FIG. 8(B).

Since the second interlayer insulating film 150*c* is selectively disposed only at the region where the gate electrode and the second wirings overlap with each other, it is easy to form an opening of a contact hole that reaches a source region or drain region of the pixel TFT.

In a driving circuit, a second interlayer insulating film 150*b* can be selectively disposed at the region where a gate wiring and a second wiring 15 1 on an insulating film 115 intersect with each other. A top view of the driving circuit corresponding to FIG. 5 is shown in FIG. 7(B).

Insulating films that contain silicon are used as the first and second interlayer insulating films. A silicon oxide film, silicon nitride film, or silicon nitride oxide film can be used as the silicon containing insulating film. A CVD method, such as a plasma CVD, decompression CVD, and ECRCVD, or a sputtering method can be used as a forming method of these films. If organosilane, such as TEOS, is used as a Si source, which is raw material gas, and $O_2$ or $O_3$ is used as an O source while performing the plasma CVD method, an insulating film, called a TEOS film, is formed. Alternatively, inorganic silane, such as $SiH_4$ (mono-silane) or disilane, can be used as the Si source of the raw material gas, and $O_2$, $O_3$, or $N_2O$ can be used as the O source. If $SiH_4$ (mono-silane) as the Si source and $O_2$, $O_3$, or $N_2O$ as the O source are used while performing the decompression CVD method, an insulating film, called an LTO film, is formed.

The silicon nitride oxide film is an insulating film that contains a predetermined amount of silicon, nitrogen, and oxygen, and is designated SiOxNy. It is noted that the concentration ratio of N to Si in the silicon nitride oxide film is made 0.1 to 0.8. The composition of the insulating film that contains silicon, oxygen, and nitrogen is controlled by properly adjusting the kind of raw material gas, flow rate, substrate temperature, pressure, RF power, and anode-cathode distance.

The first interlayer insulating film has no limited film thickness. However, when etching is conducted simultaneously with a gate insulating film or subsequently thereto so as to form a contact hole that reaches a silicon layer, it is important to conduct the etching on the condition that a satisfying selective etching ratio can be taken to the silicon layer (e.g., insulating-film material, film thickness, and etching gas) because the silicon layer is thin. Considering the condition factors, it is preferable to decrease the film thickness of the first interlayer insulating film (e.g., 200 nm or less). However, the first interlayer insulating film is required to have a film thickness enough to protect a gate wiring against oxidation in an activating step. Additionally, in order to form a micro contact hole, it is preferable to exclude a second interlayer insulating film from a contact hole formation region.

Figure 4A:
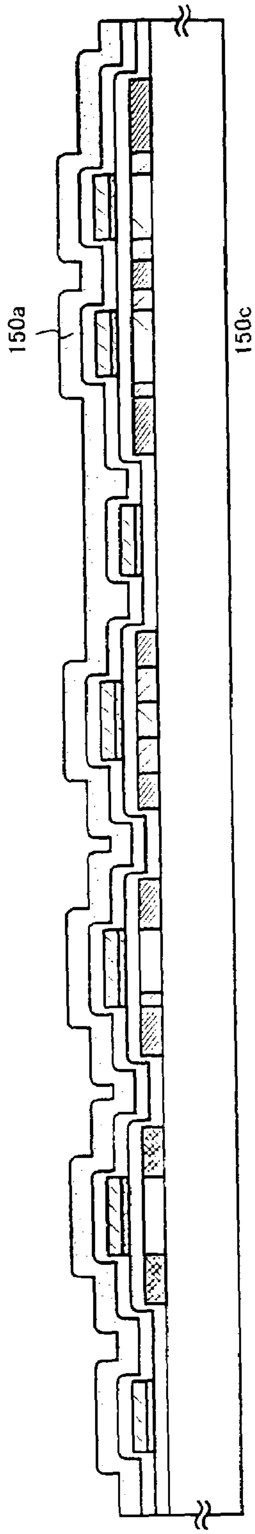
FIGS. 4(A) to 4(C) are views showing a manufacturing step of the AM-LCD.
Figure 4B:
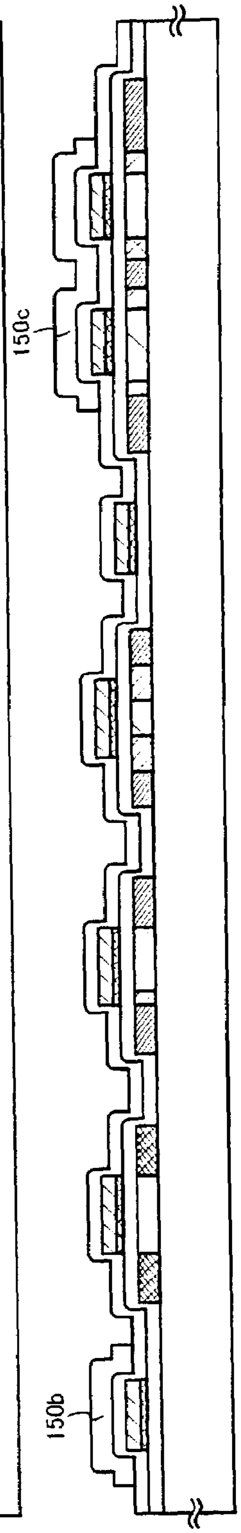
Figure 4C:
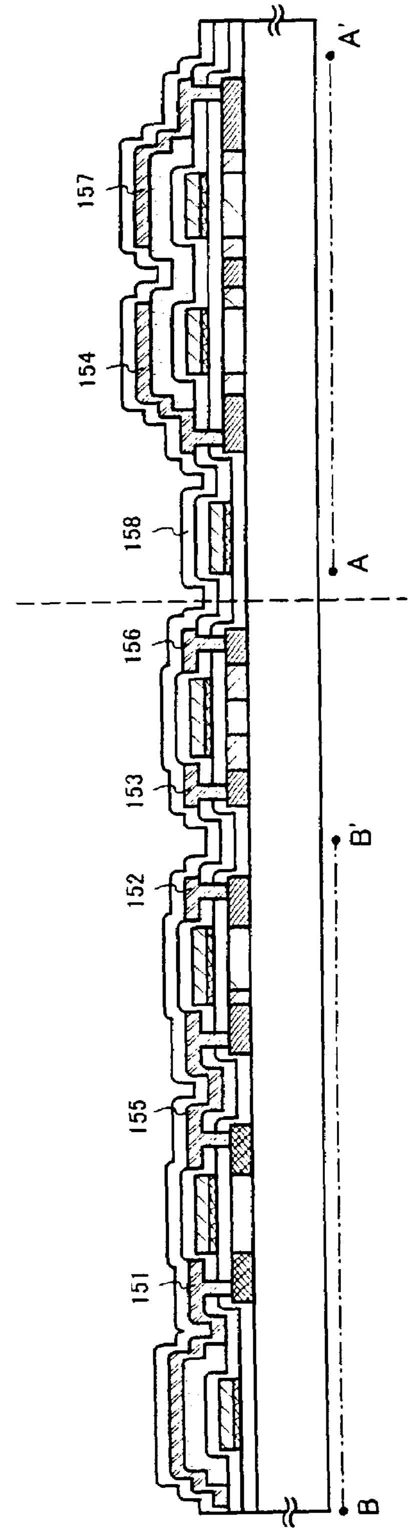

Preferably, a material for the second interlayer insulating film has a higher etching rate than that for the first interlayer insulating film, because the manufacturing process of the present invention for realizing the aforementioned structure has a step (FIG. 4(B)) where only the second interlayer insulating film selectively undergoes wet-etching.

Even when the second interlayer insulating film is formed by using the same raw material gas as the gas used for the first interlayer insulating film, the resultant second film can obtain a high etching rate if the second film is formed at a lower temperature, with a variance of more than 10 degrees, than the first interlayer insulating film.

Additionally, the selective etching ratio thereof to the second interlayer insulating film can be heightened by applying thermal annealing (750–850° C., 15 minutes-4 hours) to the first interlayer insulating film and by reducing the etching rate of the first interlayer insulating film.

Dry etching can be conducted in the step where only the second interlayer insulating film is selectively etched. If so, it is preferable that the selective etching ratio thereof to the first interlayer insulating film be adequately taken and a tapered shape be obtained according to the wet etching. The film thickness of the second interlayer insulating film is not specifically limited except that the film thickness thereof is such that the parasitic capacitance offers no problem, in other words, the film thickness thereof is more than, for example, 0.5 μm. Additionally, anisotropic etching can be conducted.

Another method of forming a contact hole that reaches a source region or drain region can also be applied in such a way that a contact hole is formed in a gate insulating film and a first interlayer insulating film according to the dry etching as shown in FIG. 12, and thereafter the second interlayer insulating film is laid thereon, and a contact hole is again formed in a second interlayer insulating film according to the wet etching.

The step of selectively etching only the second interlayer insulating film can be carried out in such a way that a thin silicon nitride film, a DLC film, an AIN film, an AINO film, and the like, are laid on the first interlayer insulating film, and thereafter these are used as blocking layers of etching so as to selectively etch the second interlayer insulating film according to the dry etching. The taper shape can be obtained by changing a resist shape even if the dry etching is carried out.

In this embodiment, the two interlayer insulating films (i.e., first and second interlayer insulating films) are used between the gate wiring and the second wiring. Instead, three interlayer insulating films or more may be used.

With the present invention constructed as mentioned above, it is possible to, in spite of a layout in which a gate electrode and a second wiring are laid on each other, eliminate an adverse effect on display characteristics caused by a parasitic capacitance. Additionally, even if an active matrix type liquid crystal display device is less than an inch diagonally in size, it is possible to satisfactorily diminish the parasitic capacitance formed between the gate wiring and the second wiring and form a minute contact hole (about 0.5 μm–1.5 μm in diameter).

A detailed description of the thus constructed invention will be provided with reference to embodiments disclosed below.

Embodiment 1

A first embodiment of the present invention will be described with reference to FIGS. 1–5. Herein, a description is provided of a method of forming a pixel circuit and a driving circuit for controlling the pixel circuit at the same time on the same substrate. It should be noted that, for an abridged description, a CMOS circuit serving as a basic circuit for a shift register circuit or buffer circuit and an n-channel type TFT that makes up a sampling circuit are shown in the driving circuit in the figure.

Figures 1A, 1B, 1C, 1D, 1E:
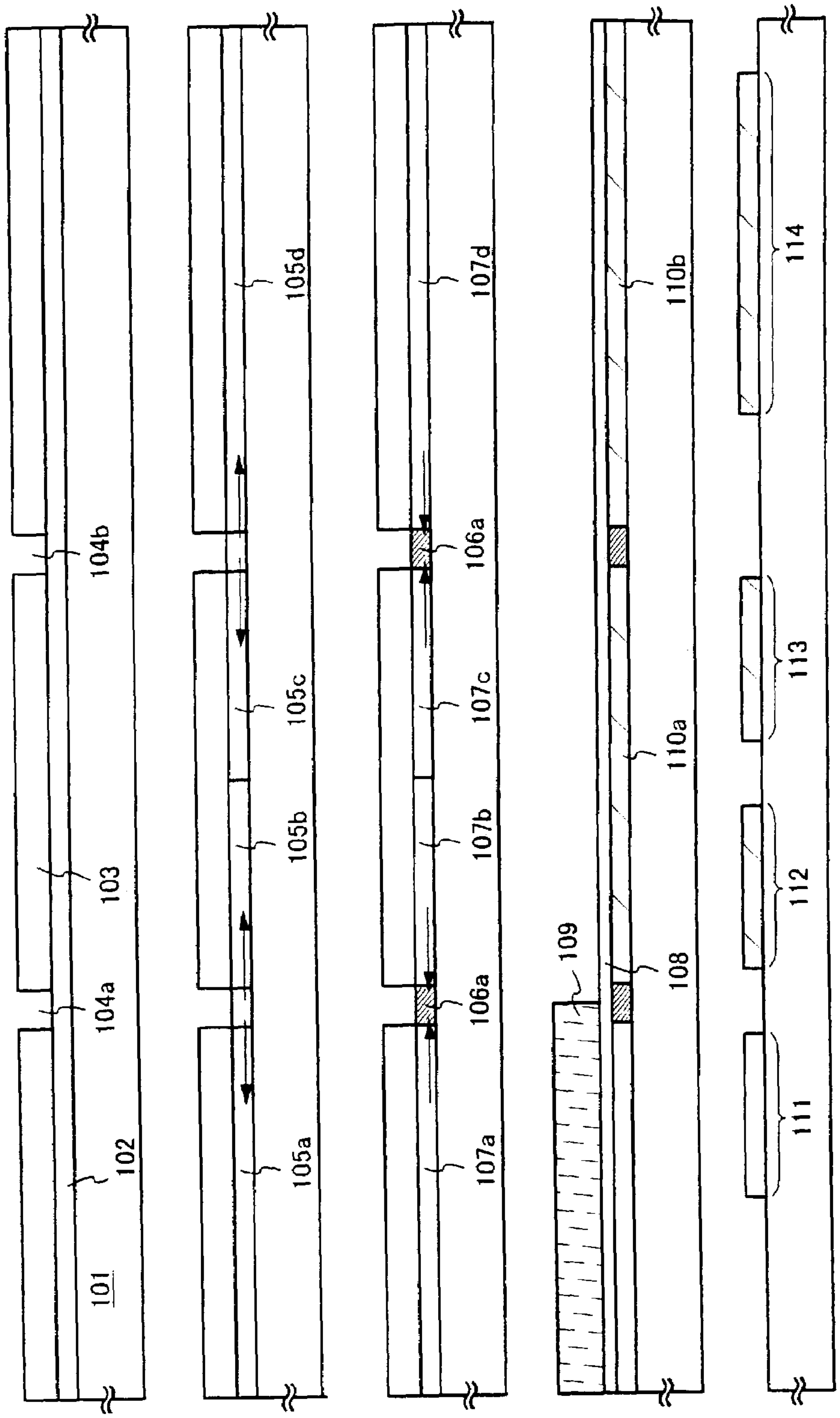
FIGS. 1(A) to 1(E) are views showing a manufacturing step of an AM-LCD.

Referring to FIG. 1(A), it is preferable to use a quartz substrate or a silicon substrate as a substrate 101. The quartz substrate is used in this embodiment. Instead, another substrate may be used in which an insulating film is applied onto the surface of a metal substrate or stainless substrate. Since heat-resisting properties resistant to a temperature of 800° C. or more are required in this embodiment, every substrate that meets this requirement can be used.

A semiconductor film 102 containing an amorphous structure whose thickness is 20–100 nm (preferably, 40–80 nm) is formed on the surface of the substrate 101 where TFTs are formed, according to a decompression heat CVD method, a plasma CVD method, or a sputtering method. An amorphous silicon film 60 nm thick is formed in this embodiment. However, this film thickness does not lead, without changes, to the final thickness of an active layer of a TFT because thermal oxidation processing is performed in a later step.

An amorphous semiconductor film, a microcrystal semiconductor film, and, additionally, a compound semiconductor film that contains the amorphous structure, such as an amorphous silicon germanium film, are known as a semiconductor film that contains the amorphous structure.

It is also effective to form a base film and the amorphous silicon film on the substrate continuously without air release. This allows contamination of the substrate surface to exert no influence upon the amorphous silicon film and allows the completed TFT to have lower characteristic variability.

Next, a mask film 103 formed of an insulating film that contains silicon is formed on an amorphous silicon film 102, and openings 104_a_, 104_b_ are formed by patterning. The openings 104_a_, 104_b_ serve as an addition region for adding a catalyst element by which crystallization is promoted in the following crystallizing step. (FIG. 1(A))

A silicon oxide film, a silicon nitride film, and a silicon nitride oxide film can be used as the insulating film that contains silicon. The silicon nitride oxide film is the insulating film that contains a predetermined amount of silicon, nitrogen, and oxygen and is designated as SiOxNy. The silicon nitride oxide film can be formed by a raw material gas of $SiH_4$, $N_2O$, and $NH_3$. Preferably, the concentration of nitrogen contained therein is from 25 atomic % to less than 50 atomic %.

Simultaneously with the patterning of the mask film 103, a marker pattern is formed which is used as a reference in a later patterning step.

Next, a semiconductor film that contains a crystal structure is formed according to a technique described in Japanese Patent Laid-Open Publication No. 247735 of 1998 (corresponding to U.S. patent application Ser. No. 09/034,041). The technique disclosed herein is a crystallizing means of using catalyst elements (one or plural elements selected from the group consisting of nickel, cobalt, germanium, tin, lead, palladium, iron, and copper) that promote crystallization when crystallizing a semiconductor film that contains an amorphous structure.

In more detail, heating processing is conducted with catalyst elements maintained on the surface of the semiconductor film that contains the amorphous structure, and thereafter the semiconductor film with the amorphous structure is changed into a semiconductor film that contains a crystal structure. A technique described in the first embodiment of Japanese Patent Laid-Open Publication No. 130652 of 1995 can be used as the crystallizing means. Both a so-called monocrystalline semiconductor film and a polycrystalline semiconductor film are included in the semiconductor film that contains the crystalline structure. However, the semiconductor film that contains the crystal structure described in this publication has a grain boundary.

In this publication a spin court method is used when forming a layer that contains catalyst elements on a mask film. However, use may be made of a means for forming a thin film that contains such catalyst elements under a vapor phase method, such as a sputtering method or a deposition method.

Preferably, the amorphous silicon film undergoes heating processing at 400–550° C. for about one hour so as to sufficiently eliminate hydrogen and obtain crystallization, depending on the hydrogen content thereof. Preferably, in this case, the hydrogen content thereof is 5 atomic % or less.

In the crystallization process, heat treatment is first conducted at 400–500° C. for about one hour, hydrogen is then released from the film, and heat treatment is again conducted at 500–650° C. (preferably 550–600° C.) for 6–16 hours (preferably 8–14 hours).

In this embodiment, nickel is used as a catalyst element, and heat treatment is conducted at 570° C. for 14 hours. As a result, crystallization progresses in directions substantially parallel to the substrate (i.e., arrow % directions in the figure) starting from the openings 104a, 104b, and, accordingly, semiconductor films (crystalline silicon films in this embodiment) 105a–105d are formed which contain a crystal structure provided with macroscopic unidirectional crystal growth. (FIG. 1(B))

Next, gettering is conducted for removing the nickel used in the crystallizing process from the crystalline silicon film. In this embodiment, while maintaining the previously formed mask film 103 as a mask, a process for adding an element (in this embodiment, phosphorus) belonging to the 15th family is performed so as to form phosphorus addition regions 106a, 106b including phosphorus (hereinafter, designated as gettering region) at the concentration of $1\times10^{19}$–$1\times10^{20}$ atoms/cm$^3$ on the exposed crystalline silicon film at the openings 104a, 104b. (FIG. 1(C))

Next, heat treatment is conducted at 450–650° C. (preferably 500–550° C.) for 24 hours (preferably 6–12 hours) in a nitrogen atmosphere. The nickel in the crystalline silicon film moves in the direction of the arrow by this treatment, and is captured in the gettering regions 106a, 106b by the gettering action of the phosphorus. In other words, the nickel is removed from the crystalline silicon film, and therefore, the concentration of the nickel included in the crystalline silicon films 107a–107d after the gettering process can be reduced to be $1\times10^{17}$ atoms/cm$^3$ or less, preferably, to $1\times10^{16}$ atoms/cm$^3$.

Subsequently, the mask film 103 is removed, and a protective film 108 is formed on the crystalline silicon films 107a–107d for a later impurity addition process. A silicon nitride oxide film or a silicon oxide film 100–200 nm thick (preferably, 130–170 nm) can be used as the protective film 108. The protective film 108 serves to prevent the crystalline silicon film from being directly exposed to plasma when adding impurities and to control the concentration thereof finely.

Thereafter, a resist mask 109 is formed thereon, and an impurity element that gives a P type (hereinafter, designated as p-type impurity element) is added through the medium of the protective film 108. As a p-type impurity element, use can be made of, representatively, an element belonging to the 13th family and, typically, boron or gallium. This process (called a channel dope process) is to control the threshold voltage of a TFT. Herein, boron is added according to an ion dope method of plasma excitation without mass-separation of diborane ($B_2H_6$). An ion implantation method with mass-separation can be used, of course.

According to this process, impurity regions 110a, 110b are formed which include the p-type impurity element (in this embodiment, boron) at the concentration of $1\times10^{15}$–$1\times10^{18}$ atoms/cm$^3$ (representatively, $5\times10^{16}$–$5\times10^{17}$ atoms/cm$^3$). In this specification, the impurity region (including no phosphorus) that includes the p-type impurity element within the range of the aforementioned concentration is defined as a p-type impurity region (b). (FIG. 1(D)).

Subsequently, the resist mask 109 is removed, and then the crystalline silicon film undergoes patterning so as to form island semiconductor layers 111–114 (hereinafter, designated as active layer). By selectively adding the nickel and undergoing crystallization, the active layers 111–114 are formed with much superior crystalline silicon films in crystallinity. Specifically, it has a crystal structure in which cylinder-shaped or pillar-shaped crystals are arranged in a specific direction. After the crystallization, the nickel is removed or decreased by the gettering action of phosphorus, so that the concentration of the catalyst element that remains in the active layers 111–114 is $1\times10^{17}$ atoms/cm$^3$ or less, preferably, $1\times10^{16}$ atoms/cm$^3$. (FIG. 1(E))

The active layer 111 of a p-channel type TFT is a region that does not include an impurity element intentionally added, and the active layers 112–114 of an n-channel type TFT are p-type impurity regions (b). In this specification, the active layers 111–114 in this state are all defined as intrinsic or substantially intrinsic. In other words, the region to which an impurity element is added intentionally to such an extent that the TFT can work smoothly can be regarded as a substantially intrinsic region.

Subsequently, an insulating film 10–100 nm thick that contains silicon is formed according to the plasma CVD method or the sputtering method. In this embodiment, a silicon nitride oxide film 30 nm thick is formed. This insulating film that contains silicon can be used in the form of a single layer or lamination layer of another insulating film that contains silicon.

Thereafter, heat treatment is conducted at a temperature of 800–1150° C. (preferably 900–1000° C.) for 15 minutes-8 hours (preferably, 30 minutes–2 hours) in an oxidizing atmosphere (thermal oxidation process). In this embodiment, heat treatment is conducted at 950° C. for 80 minutes in an atmosphere where hydrogen chloride of 3 volume % is added to an oxygen atmosphere. The boron added in the process of FIG. 1(D) is activated during the thermal oxidation process. (FIG. 2(A))

Either a dry oxygen atmosphere or a wet oxygen atmosphere can be used as the oxidizing atmosphere. The dry oxygen atmosphere is suitable for decreasing crystal defects in a semiconductor layer. In this embodiment, the oxygen atmosphere is added with halogen. Instead, 100% oxygen atmosphere may be used.

During the thermal oxidation process, an oxidation reaction progresses also at an interface between the insulating film that contains silicon and the active layers 111–114. In the present invention, considering this, the film thickness of a finally formed gate insulating film 115 is adjusted to be 50–200 nm (preferably, 100–150 nm). In the thermal oxidation process of this embodiment, a layer portion of a 25 nm thickness of the active layer 60 nm thick is oxidized, and accordingly, the film thickness of the active layers 111–114 turns to 45 nm. Additionally, a thermal oxidation film 50 nm thick is added to a 30 nm–thick insulating film that contains silicon, and accordingly, the film thickness of the final gate insulating film 115 turns to 110 nm.

Thereafter, resist masks 116–119 are newly formed. Impurity regions 120–122 that represent an n type are then formed by adding an impurity element that gives the n type (hereinafter, designated as n-type impurity element). Representatively an element that belongs to the 15th family, typically, phosphorus or arsenic can be used as the n-type impurity element. (FIG. 2(B))

The impurity regions 120–122 are to serve as an LDD region in an n-channel type TFT of a CMOS circuit and a sampling circuit in a later stage. The n-type impurity element whose concentration is $2\times10^{16}$–$5\times10^{19}$ atoms/cm$^3$ ($5\times10^{17}$–$5\times10^{18}$ atoms/cm$^3$ representatively) is included in the impurity region formed herein. In this specification, the impurity region that includes the n-type impurity element within the range of the aforementioned concentration is defined as n-type impurity region (b).

Herein, phosphorus is added at a concentration of $1\times10^{18}$ atoms/cm$^3$ according to an ion dope method in which phosphine ($PH_3$) undergoes plasma excitation without mass separation. An ion implantation method that performs the mass separation can be used, of course. In this process, phosphorus is added to the crystalline silicon film through the medium of the gate insulating film 115.

Figures 2A, 2B, 2C, 2D, 2E:
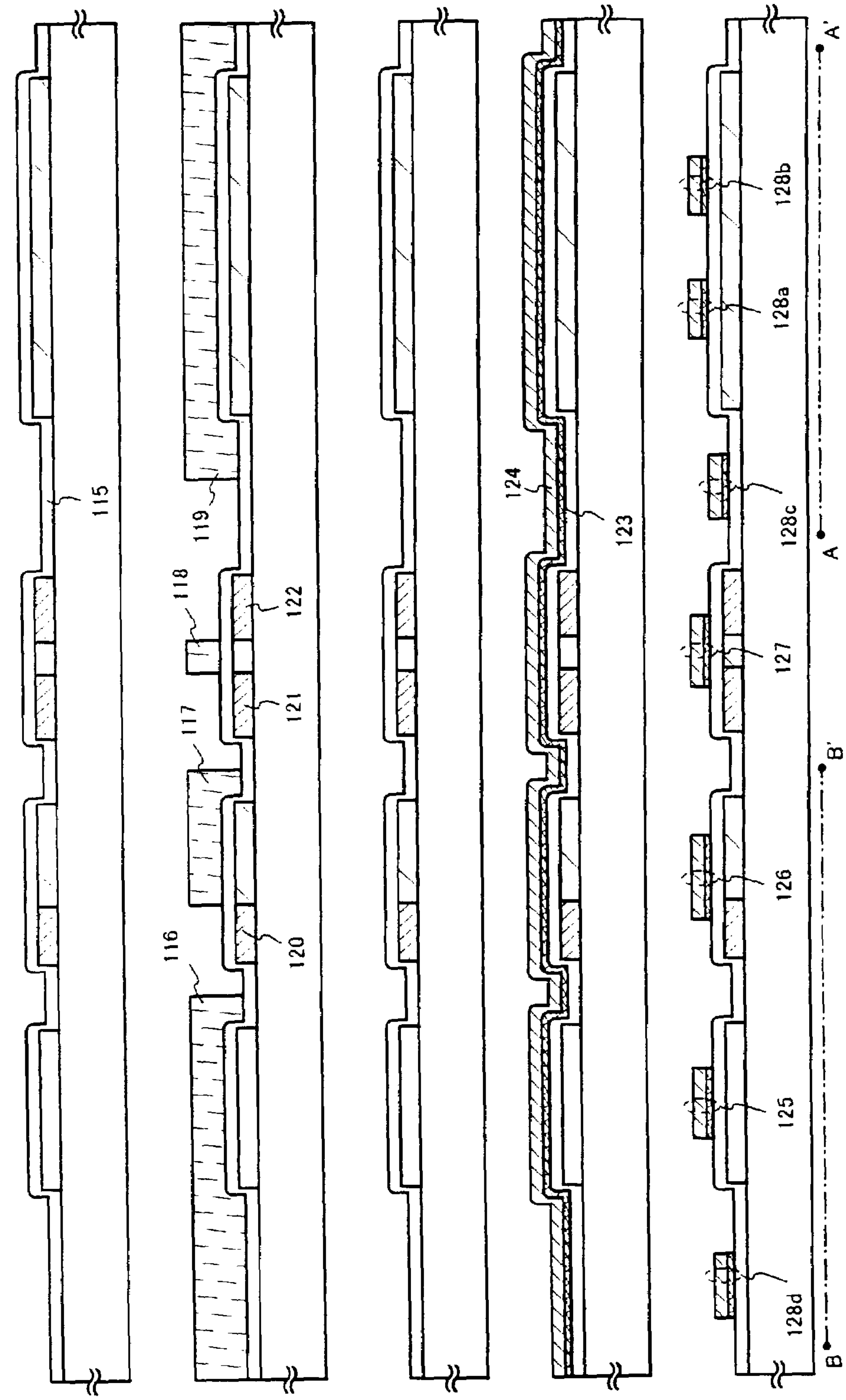
FIGS. 2(A) to 2(E) are views showing a manufacturing step of the AM-LCD.

Thereafter, heat treatment is conducted in an inert atmosphere of 600–1000° C. (preferably 700–800° C.), and thereby, the phosphorus added in the process of FIG. 2(B) is activated. In this embodiment, heat treatment of 800° C. and 1 hour is conducted in a nitrogen atmosphere. (FIG. 2(C))

At this time, it is possible to restore the interface between the active layer and the gate insulating film and restore the active layer damaged when phosphorus is added, simultaneously. It is preferable to, for this activating process, conduct furnace annealing that uses an electrically-heated oven, but optical annealing, such as lamp annealing or laser annealing, can be conducted together therewith.

This process makes clear a junction with a boundary portion of the n-type impurity regions (b) 120–122, namely, an intrinsic or substantially intrinsic region (of course, a p-type impurity region (b) is also included therein) that exists around the n-type impurity regions (b). This means that the LDD region and the channel formation region can form a very excellent junction when the TFT is completed later.

Thereafter, a conductive film that serves as a gate wiring is formed. Though the gate wiring can be formed with a single-layer conductive film, a lamination film, such as two-layer or three- layer film, is preferably used if necessary. In this embodiment, a lamination film with first and second conductive films 123, 124 is formed. (FIG. 2(D))

Herein, as the first conductive film 123 and the second conductive film 124, use may be made of a conductive film of an element selected from the group consisting of tantalum (Ta), titanium (Ti), molybdenum (Mo), tungsten (W), chrome (Cr), and silicon (Si), or a conductive film of a compound largely composed of the aforementioned element (tantalum nitride film, tungsten nitride film, and titanium nitride film, representatively), or an alloy film of a combination of the aforementioned elements (Mo—W alloy film, Mo—Ta alloy film, and tungsten silicide film, representatively).

The first conductive film 123 can be 10–50 nm thick (20–30 nm. preferably), and the second conductive film 124 can be 200–400 nm thick (250–350 nm, preferably). In this embodiment, a tungsten nitride (WN) film 50 nm thick is used as the first conductive film 123, and a tungsten film 350 nm thick is used as the second conductive film 124. It is effective to form a silicon film, not shown, (doped with phosphorus) to be about 2–20 nm thick under the first conductive film 123. As a result, it is possible to improve the adhesive properties of the conductive film formed thereon and achieve antioxidation.

It is also effective to use a tantalum nitride film as the first conductive film 123, and a tantalum film as the second conductive films 124.

Thereafter, gate wirings 125–128 400 nm thick are formed by etching the first conductive film 123 and the second conductive film 124 together. At this time, the gate wirings 126,127 formed at the driving circuit are formed to be laid on a part of the n-type impurity regions (b) 120–122 and the gate insulating film 115. This laminated portion turns to a Lov region later. (FIG. 2(E))

Figure 6A:
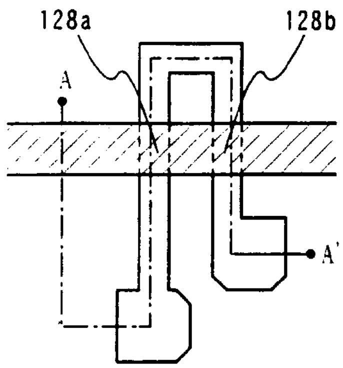
FIGS. 6(A) and 6(B) are top views in a manufacturing step of the AM-LCD.
Figure 7A:
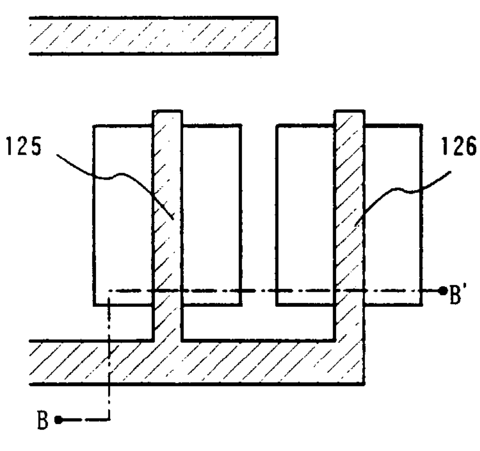
FIGS. 7(A) and 7(B) are top views in a manufacturing step of the AM-LCD.
Figure 7B:
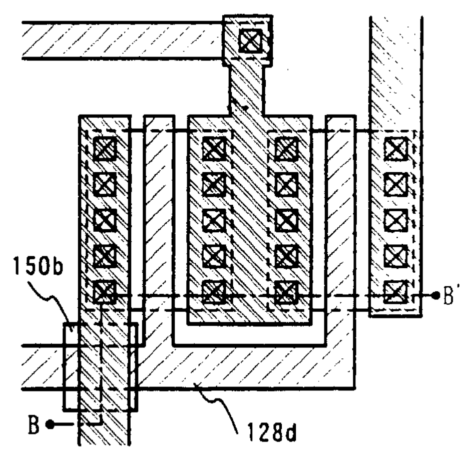

FIG. 6(A) and FIG. 7(A) are top views showing this state. Section A–A' of FIG. 6(A) corresponds to FIG. 2(E). Section B–B' of FIG. 7(A) corresponds to FIG. 2(E). In FIG. 2(E), the gate wirings 128*a*, 128*b*, and 128*c* are each seen as an individual section, but they are actually formed with a continuous pattern.

After forming the gate wirings, to protect the second conductive film, a gate electrode structure can be created in which the tantalum nitride film or the tungsten nitride film are piled, and by conducting the patterning again, the second conductive film is enclosed.

Thereafter, a resist mask 129 is formed, and by adding a p-type impurity element (boron, in this embodiment), impurity regions 130,131 that include a high concentration of boron are formed. In this embodiment, the boron is added at a concentration of $3\times10^{20}$–$3\times10^{21}$ atoms/cm$^3$ ($5\times10^{20}$–$1\times10^{21}$ atoms/cm$^3$, representatively) according to the ion dope method (ion implantation method is applicable, of course) that uses diborane ($B_2H_6$). In this specification, the impurity region that includes a p-type impurity element within the range of the aforementioned concentration is defined as p-type impurity region (a). (FIG. 3(A))

Thereafter, the resist mask 129 is removed, and resist masks 132–134 are formed so as to cover the gate wiring and a region that turns to a p-channel type TFT. The n-type impurity element (phosphorus, in this embodiment) is then added to form impurity regions 135–141 that include a high concentration of phosphorus. Herein, the ion dope method (ion implantation method is applicable, of course) that uses phosphine ($PH_3$) is applied again. The concentration of phosphorus in this region is $1\times10^{20}$–$1\times10^{21}$ atoms/cm$^3$ ($2\times10^{20}$–$5\times10^{21}$ atoms/cm$^3$, representatively). (FIG. 3(B))

In this specification, the impurity region that includes an n-type impurity element within the range of the aforementioned concentration is defined as n-type impurity region (a). Phosphorus or boron that has already been added in the previous stage is included in a region where the impurity regions 135–141 are formed. However, since a sufficiently high concentration of phosphorus is added, there is no need to consider the influence of the phosphorus or the boron added previously. Therefore, in this specification, no problem will arise even if the impurity regions 135–141 are each described as the n-type impurity region (a).

Thereafter, an n-type impurity element (phosphorus, in this embodiment) is added self-aligned with-the gate wirings 125–128 as masks. The thus formed impurity regions 143–146 are adjusted to be added with phosphorus whose concentration is ½–1/10 (⅓–¼, representatively) times as high as the n-type impurity region (b) (note that this concentration is 5–10 times as high as that of the boron added in the aforementioned channel dope process, i.e. is, representatively, $1\times10^{16}$–$5\times10^{18}$ atoms/cm$^3$ and, typically, $3\times10^{17}$–$3\times10^{18}$ atoms/cm$^3$.) In this specification, the impurity region (excluding the p-type impurity region (a)) that includes an n-type impurity element within the range of the aforementioned concentration is defined as n-type impurity region (c). (FIG. 3(C)).

In this process, phosphorus whose concentration is $1\times10^{16}$–$5\times10^{18}$ atoms/cm$^3$ is added also to all the impurity regions except the part concealed by the gate wiring. However, since the concentration thereof is very low, no influence is exerted upon the function of the individual impurity region. The n-type impurity regions (b)143–146 have been already added with boron, whose concentration is $1\times10^{15}$–$1\times10^{18}$ atoms/cm$^3$, in the channel dope process. However, since the concentration of the phosphorus to be added in this process is 5–10 times as high as that of the boron included in the p-type impurity region (b), the boron can be regarded as exerting no influence upon the function of the n-type impurity region (b), as in the previous case.

However, strictly, the phosphorus concentration in a part of the n-type impurity regions (b) 147,148 that overlaps with the gate wiring is still $2\times10^{16}$–$5\times10^{19}$ atoms/cm$^3$, and, on the other hand, a part thereof that has no overlap with the gate wiring is further added with phosphorus whose concentration is $1\times10^{16}$–$5\times10^{18}$ atoms/cm$^3$. That is, the part that has no overlap therewith includes a slightly higher phosphorus concentration.

When forming the n-type impurity region (c), a cap film (25–100 nm) for preventing the gate wiring from being oxidized can be formed beforehand, and an offset region can be formed. The offset region represents a high-resistance region that is formed to be contiguous to the channel formation region and that does not form an inversion layer (channel region) because a gate voltage is not applied though the region comprises a semiconductor film that has the same composition as the channel formation region. To lower an Off-state current value, it is important to rigidly restrain the LDD region and the gate wiring from overlapping with each other. In that sense, it can be effective to form the offset region.

Next, a first interlayer insulating film 149 is formed. The film 149 can be formed with an insulating film that contains silicon, more specifically a silicon nitride film, a silicon oxide film, a silicon nitride oxide film, or a lamination film that is made by bonding the aforementioned films together. A film thickness thereof can be 100–400 nm, preferably, 200 nm or less. In this embodiment, the plasma CVD method is carried out on the condition that a film formation temperature is 325° C., raw material gas is $SiH_4$ and $N_2O$, and a silicon nitride oxide film to be used is 200 nm thick (herein, a nitrogen concentration is less than 5 atomic %).

Thereafter, thermal treatment is conducted to activate an n-type or p-type impurity element added with each individual concentration. This process can be performed according to the furnace anneal method, the laser anneal method, the lamp anneal method, or a combined method-with each other. If the furnace anneal method is performed, the temperature can be 500–800° C., preferably, 550–600° C. in an inert atmosphere. In this embodiment, thermal treatment is performed at 800° C. for an hour, thereby activating the impurity element and lessening the etching rate of the first interlayer insulating film 149. As a result, the selective etching ratio to a second interlayer insulating film, which is formed hereafter, is increased. While the etching rate (i.e., value of the LAL 500 at 20° C.) is 260 nm/min immediately after the first interlayer insulating film 149 is formed, the etching rate of the first interlayer insulating film 149 can be lessened to be 88 nm/min after the thermal annealing. (FIG. 3(D))

After the activating process, heat treatment is conducted at 300–450° C. for 1–4 hours in an atmosphere that contains hydrogen of 3–100% so as to hydrogenate the active layer. This is a process for terminating a dangling bond of a semiconductor layer by means of thermally excited hydrogen. Plasma hydrogenation (i.e., plasma-excited hydrogen is used) can be performed as another hydrogenation means.

After finishing the activating process, a second interlayer insulating film 150*a* 500 nm–1.5 μm, preferably, 500 nm–800 nm thick is formed on the first interlayer insulating film 149. The second interlayer insulating film 150*a* is formed to decrease a parasitic capacitance generated at an overlap between a gate wiring and an upper layer wiring or an overlap between a gate electrode (corresponding to an upper part of the channel formation region) and the upper layer wiring. The material of the second interlayer insulating film 150*a* is selected to have a higher etching rate than the first interlayer insulating film (plasma CVD method, 400° C. film formation temperature, $SiH_4$, silicon nitride oxide film which is used $N_2O$ for raw material gas (10 atomic % or less nitrogen concentration), 210 nm/min etching rate). The film thickness thereof is 500 nm.

Thereafter, patterning is conducted by dry etching or wet etching, and thereby the second interlayer insulating film is left only at regions (150*b*, 150*c*) where a source wiring or a drain wiring formed later overlaps with the gate wiring. In this embodiment, patterning is conducted using the wet etching of LAL 500. As mentioned above, while the etching rate of the second interlayer insulating film is 210 nm/min, that of the first interlayer insulating film is 88 nm/min, and therefore, a selective etching ratio can be taken sufficiently. The selective etching ratio between the first and second interlayer insulating films is 1.5 or more, preferably, 3–5. (FIG. 4(B))

Thereafter, patterning is applied to both the first interlayer insulating film and the gate insulating film so as to form a contact hole that reaches the source region or drain region of a TFT. Since the thickness of the source region or drain region is thin (10 nm–50 nm), it is important that the etching condition be adjusted so that the amount of over etching (i.e., polysilicon film loss amount) does not exceed a predetermined value.

Table 1 shows the theoretical value of the polysilicon film loss amount when forming the contact hole.

In Table 1, the prerequisite is that dry etching whose etching rate is 30 nm/min is conducted in a state where a gate insulating film (silicon oxide film that contains nitrogen, 120 nm±5% film thickness) and a first interlayer insulating film (silicon oxide film that contains nitrogen, 200 nm±5% film thickness) are piled on the polysilicon film. The etching rate indicates a value at 20° C. of a mixed solution (made by STELLA CHEMIFA, brand name LAL500) that contains 7.13% ammonium hydrogen fluoride ($NH_4HF_2$) and 15.4% ammonium fluoride. The vertical axis indicates the scattering of the etching rate, and the horizontal axis indicates the selective etching ratio between the polysilicon film and the silicon oxide film that contains nitrogen.

It can be read from Table 1 that the selective etching ratio is required to be more than 10 if it is desired that, for example, the scattering of the etching rate is 5% and the over etching amount is a predetermined value, e.g., less than 5 nm. Thus, it is possible to determine how much the selective etching ratio is required in order to fix the over etching amount to be less than a predetermined value on the basis of the Table 1. Additionally, it is possible to determine how wide the scattering of the etching rate is limited when the selective etching ratio is fixed at a certain value. Additionally, it is a conclusion that it is difficult to form a contact hole unless the selective etching ratio is large and the scattering of the etching rate is limited to have a minimum value, when making a table showing that the first interlayer insulating film is thicker than 200 nm in the same manner as in Table 1.

In this embodiment, an insulating material in which the selective etching ratio to polysilicon is 12–15 is used to limit the scattering of the etching rate within 5%. Accordingly, a contact hole that has almost no over etching can be formed.

Thereafter, source wirings 151–154 and drain wirings 155–157 are formed. It is preferable to form the contact hole by the dry etching when the size of the contact hole is 1 μm or less. It is noted that the drain wiring 155 is used common for both a p-channel type TFT and an n-channel type TFT in order to form a CMOS circuit. In this embodiment, the wiring is made It three-layer lamination film consisting of a 200 nm Ti film, a 500 nm aluminum film that contains Ti, and a 100 nm Ti film, which are bonded together continuously according to the sputtering method (not shown).

Figure 6B:
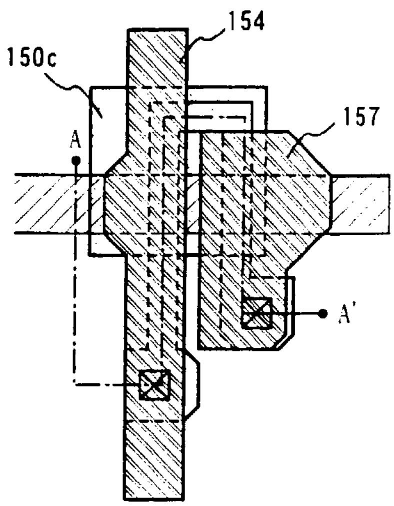

Thereafter, a passivation film 50–500 nm thick (200–300 nm, representatively) 158 is formed by using a silicon nitride film, a silicon oxide film, or a silicon nitride oxide film. (FIG. 4(C)) Upper views in this state are shown in FIG. 6(B) and FIG. 7(B). Section A–A' of FIG. 6(B) corresponds to A–A' of FIG. 4(C). Section B–B' of FIG. 7(B) corresponds to B–B' of FIG. 4(C).

At this time, in this embodiment, plasma processing is conducted using gas that contains hydrogen, such as $H_2$ or $NH_3$, before a film is formed, and heat treatment is conducted after the film is formed. The hydrogen excited by this preprocessing is supplied to the first and second interlayer insulating films. Since the heat treatment is conducted in this state, the quality of the passivation film 158 is improved, and the hydrogen added to the first and second interlayer insulating films diffuses throughout the lower side. As a result, the active layer can be effectively hydrogenated.

A hydrogenation process can be further conducted after the passivation film 158 is formed. For example, heat treatment can be conducted at 300–450° C. for 1–12 hours in an atmosphere that contains hydrogen of 3–100%. Alternatively, a similar effect can be obtained by using a plasma hydrogenation method. It is noted that the passivation film 158 can be provided with an opening (not shown), after the hydrogenation process is finished, at a position where a contact hole for connecting the pixel electrode to the drain wiring is formed.

Thereafter, a third interlayer insulating film 159 formed with organic resin is formed to be about 1 μm thick. As the organic resin, use can be made of, such as, polyimide, acrylic resin, polyamide, polyimide amid, and BCB (benzocyclobutene). The advantage of using the organic resin film is that a film formation method is easy, a parasitic capacitance can be decreased because a dielectric constant is low, or it is superior in evenness. Organic resin films other than the aforementioned resin films, or organic SiO compounds can be used. Herein, acrylic resin is used, and heat burning is conducted to form it.

Thereafter, a shielding film 160 is formed on the third interlayer insulating film 159 at a region that turns to a pixel circuit. In this specification, the term "shielding film" is used to mean that it shields something from light and electromagnetic radiation. The shielding film 160 is formed to be 100–300 nm thick, which is a film formed with an element selected from the group consisting of aluminum (Al), titanium (Ti), and tantalum (Ta) or a film largely having any one of the aforementioned elements. In this embodiment, an aluminum film that contains 1 wt % titanium is formed to be 125 nm thick.

If an insulating film, such as a silicon oxide film, is formed to be 5–50 nm thick on the third interlayer insulating film 159, the adhesion properties of the shielding film formed thereon can be improved. Additionally, if plasma processing that uses $CF_4$ gas is applied onto the surface of the third interlayer insulating film 159 formed with the organic resin, the adhesion properties of the shielding film formed thereon can be improved because of surface property modification.

It is also possible to form not only the shielding film but also other connection wirings by using an aluminum film that contains this titanium. For example, a connection wiring can be formed for connection between circuits within the driving circuit. In this case, it is necessary to beforehand form a contact hole in the third interlayer insulating film before a material for forming the shielding film or connection wiring is made a film.

Thereafter, an oxide 161 having a thickness of 20–100 nm (30–50 nm. preferably) is formed on the surface of the shielding film 160 according to the anodic oxidation method or the plasma oxidation method (in this embodiment, anodic oxidation method). In this embodiment, since a film that largely contains aluminum is used as the shielding film 160, an aluminum oxide film (alumina film) is formed as the anodic oxide 161.

In this anodizing process, a tartaric acid ethylene glycol solution is first formed that is sufficiently small in alkali ion concentration. This is a solution in which a 15% tartaric acid ammonium solution and ethylene glycol are mixed by a ratio of 2:8. This is added with ammonia water and is adjusted to be pH 7±0.5. Subsequently, a platinum electrode that serves as a cathode is provided in this solution, a substrate provided with the shielding film 160 is then soaked in the solution, and, with the shielding film 160 as an anode, a constant direct current (several mA-tens mA) is passed.

The voltage between the cathode and the anode in the solution changes with the lapse of time in accordance with the growth of the anodic oxide. The voltage is raised at the pressure rate of 100V/min while maintaining a fixed current, and the anodising is completed just when the voltage reaches 45V. Thus, the anodic oxide 161 about 50 nm thick can be formed on the surface of the shielding film 160. As a result, the thickness of the shielding film 160 becomes 90 nm. It should be noted that the numerical values relating to the anodic oxidation method described herein is only an example, and, as a matter of course, the optimum value changes according to, for example, the size of an element to be formed.

Herein, the insulating film is arranged to be provided only on the surface of the shielding film according to the anodic oxidation method. Instead, the insulating film may be formed according to a vapor phase method, such as plasma CVD method, heat CVD method, or sputtering method. If so, it is preferable to make the film thickness 20–100 nm (30–50 nm, preferably). Additionally, use may be made of a silicon oxide film, a silicon nitride film, a silicon nitride oxide film, a DLC(diamond like carbon) film, a tantalate film, or an organic resin film. Additionally, a lamination film as a combination of these films may be used.

Thereafter, a contact hole that reaches the drain wiring 157 is formed in the third interlayer insulating film 159 and the passivation film 158 so as to form a pixel electrode 162. A pixel electrode 163 is an electrode of another adjoining pixel. As the pixel electrodes 162,163, transparent conductive films can be used in the case of a transmission type liquid crystal display device, and, on the other hand, metallic films can be used in the case of a reflection type liquid crystal display device. Herein, for the transmission type liquid crystal display device, an indium tin oxide (ITO) film is formed to be 110 nm thick under the sputtering method.

At this time, the pixel electrode 162 and the shielding film 160 overlap with each other with the anodic oxide 161 therebetween, and a capacitance storage 164 is formed. In this case, it is preferable to set the shielding film 160 at a floating state (i.e., electrically isolated state) or at a fixed potential, preferably, common potential (i.e., intermediate potential of a picture signal sent as data).

An active matrix substrate that has both the driving circuit and the pixel circuit on the same substrate is completed in this way. In FIG. 5, the driving circuit is provided with a p-channel type TFT 301 and n-channel type TFTs 302,303, and the pixel circuit is provided with a pixel TFT 304 comprising an n-channel type TFT.

A top view corresponding to the section of FIG. 5 is shown in FIG. 8(B), and the same reference characters are used. The top view shown in FIG. 6(B) shows a part of FIG. 8(A), and the same reference characters are used.

The channel formation region 201, source region 202, and drain region 203 are formed in the p-channel type TFT 301 of the driving circuit, each as the p-type impurity region (a). Strictly, in the source region 202 and the drain region 203, phosphorus is included at the concentration of $1\times10^{16}$–$5\times10^{18}$ atoms/cm$^3$.

A channel formation region 204, source region 205, drain region 206 are formed in the n-channel type TFT 302, and in the TFT 302, further, a region 207 overlapping with the gate wiring with the gate insulating film therebetween is formed between the channel formation region and the drain region. (Note that the region 207 is designated as Lov region in this specification. "ov" means "overlap".) At this time, the Lov region 207 contains phosphorus at the concentration of $2\times10^{16}$–$5\times10^{19}$ atoms/cm$^3$, and is formed so as to completely coincide with the gate wiring.

A channel formation region 208, source region 209, drain region 210, and LDD regions 211,212 between which the channel formation region is placed are formed in the n-channel type TFT 303. In other words, the LDD region is formed between the source region and the channel formation region and between the drain region and the channel formation region.

In this structure, a part of the LDD regions 211, 212 is placed to overlap with the gate wiring. Therefore, a region (Lov region) overlapping with the gate wiring through the medium of the gate insulating film and a region (Loff region) not overlapping therewith are realized. (Note that a region not overlapping with the gate wiring is designated as Loff region in this specification. "off" means "offset".)

To channel-length 3–7 $\mu$m, the length (width) of the Lov region 207 of the n-channel type TFT 302 can be 0.3–3.0 $\mu$m, representatively, 0.5–1.5 $\mu$m. The length (width) of the Lov region of the n-channel type TFT 303 can be 0.3–3.0 $\mu$m, representatively, 0.5–1.5 $\mu$m, and the length (width) of the Loff region can be 1.0–3.5 $\mu$m, representatively, 1.5–2.0 $\mu$m. The length (width) of the Loff regions 217–220 provided in the pixel TFT 304 can be 0.5–3.5 $\mu$m, representatively, 2.0–2.5 $\mu$m.

In this embodiment, the gate wiring has a double gate structure. Instead, a multi gate structure, such as a triple gate structure, may be employed to improve the reliability of each circuit, or a single gate structure may be employed.

In this embodiment, the alumina film whose dielectric constant is 7–9, which is high, is used as a dielectric material of the capacitance storage. Thereby, the occupation area of the capacitance storage required to form a necessary capacity can be reduced. In addition, by using the shielding film formed on the pixel TFT, as in this embodiment, as the other electrode of the capacitance storage, the aperture ratio of an image display panel of an active matrix type liquid crystal display device can be improved.

The present invention has no need to be limited to the structure of the capacitance storage shown in this embodiment. For example, use can be made of the capacitance storage of the structure described in Patent Application No. 316,567 of 1997, patent application Ser. No. 273,444 of 1997, and patent application Ser. No. 254,097 of 1998, each filed by the present applicant.

Additionally, the structure of the present invention is characterized in that the second interlayer insulating film is provided in the region where the gate wiring and the upper-layer wiring overlap with each other. Therefore, structures other than this can be properly determined by a performer.

Figure 9:
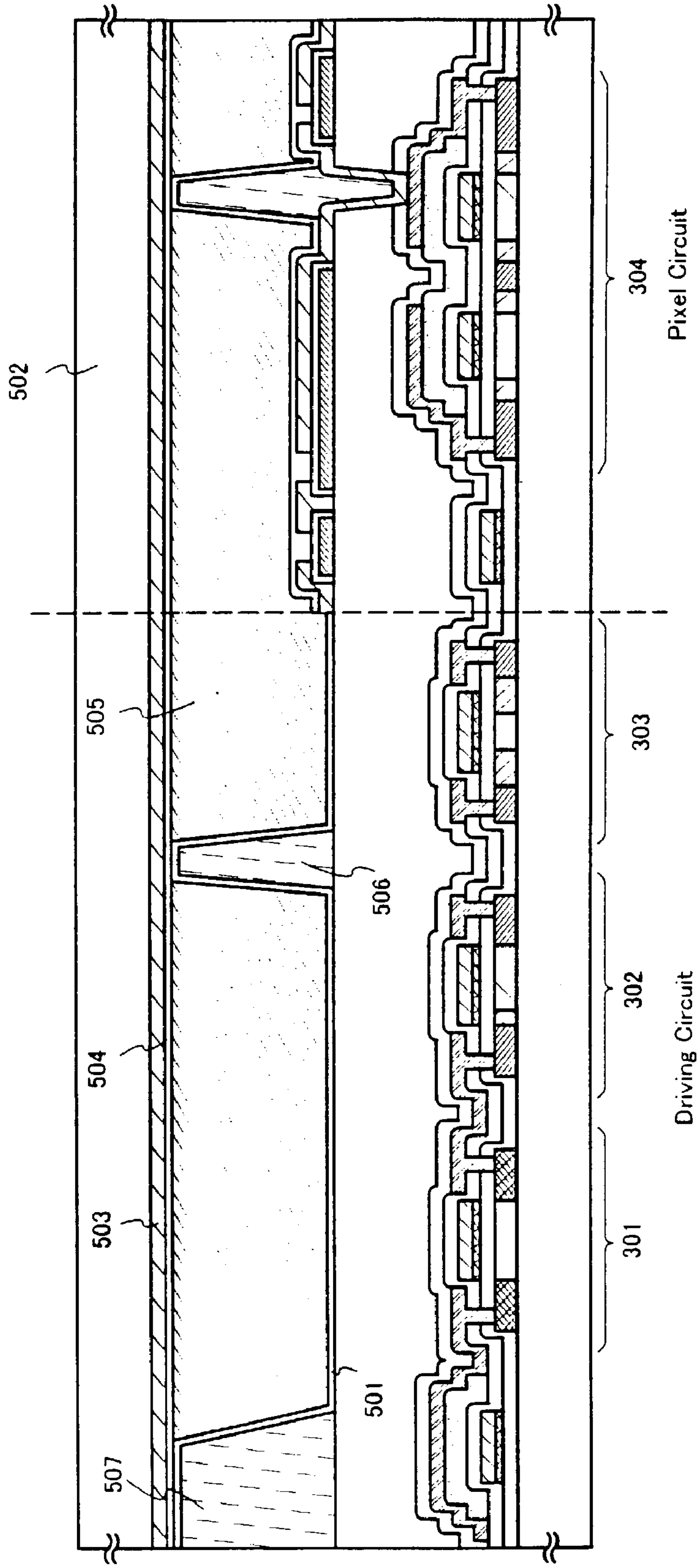
FIG. 9 is a sectional structural view of a liquid crystal display.

A description will be provided of a process where an active matrix type liquid crystal display device is made from an active matrix substrate. As shown in FIG. 9, an oriented film 501 is formed to the substrate of FIG. 5. In this embodiment, a polyimide film is used as the oriented film. An opposed substrate 502 is provided with a transparent conductive film 503 and an oriented film 504. A color filter or a shielding film can be formed in the opposed substrate if necessary.

And then, after forming the oriented film, rubbing treatment is applied thereto, and adjustment is made so that liquid crystal molecules are oriented at a fixed pre-tilt angle. And then, the pixel circuit, the active matrix substrate with the driving circuit, and the opposed substrate are bonded together, with a sealant 507 or spacer 506*a* therebetween, according to a known cell assemblage process. Thereafter, a liquid crystal 505 is injected between the two substrates, and complete sealing is accomplished by a sealing agent (not shown). A known liquid crystal material can be used for the liquid crystal. The active matrix type liquid crystal display device shown in FIG. 9 is thus completed.

Now, the structure of the active matrix type liquid crystal display will be described with reference to the perspective view of FIG. 10. In order to correspond FIG. 10 to the sectional structure views of FIGS. 1–5, the same reference characters as in FIGS. 1–5 are used in FIG. 10. The active matrix substrate is comprised of a pixel circuit 801, a gate line (scanning line) side driving circuit 802, and a source line (signal line) side driving circuit 803, each formed on a quartz substrate 101. The pixel TFT 304 of the pixel circuit is an n-channel type TFT, and the driving circuit provided therearound is constructed based on a CMOS circuit. The gate line side driving circuit 802 and the source line side driving circuit 803 are connected to the pixel circuit 801 by the gate wiring 128 and the source wiring 154, respectively. Additionally, connection wirings 806,807 are provided that extend from an external input-output terminal 805, to which a FPC 804 is connected, to an input-output terminal of the driving circuit.

Figure 10:
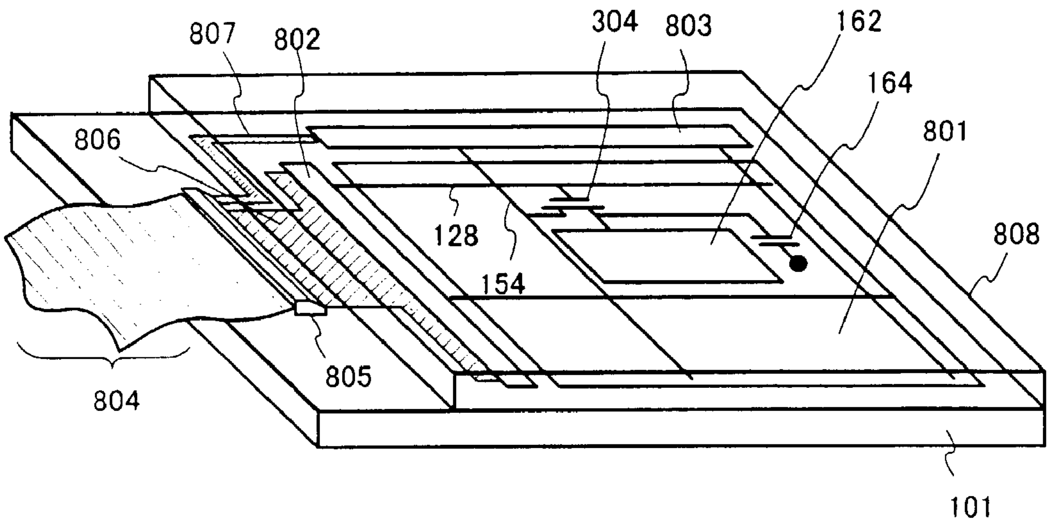
FIG. 10 is a view showing the exterior of the AM-LCD.
Figure 11:
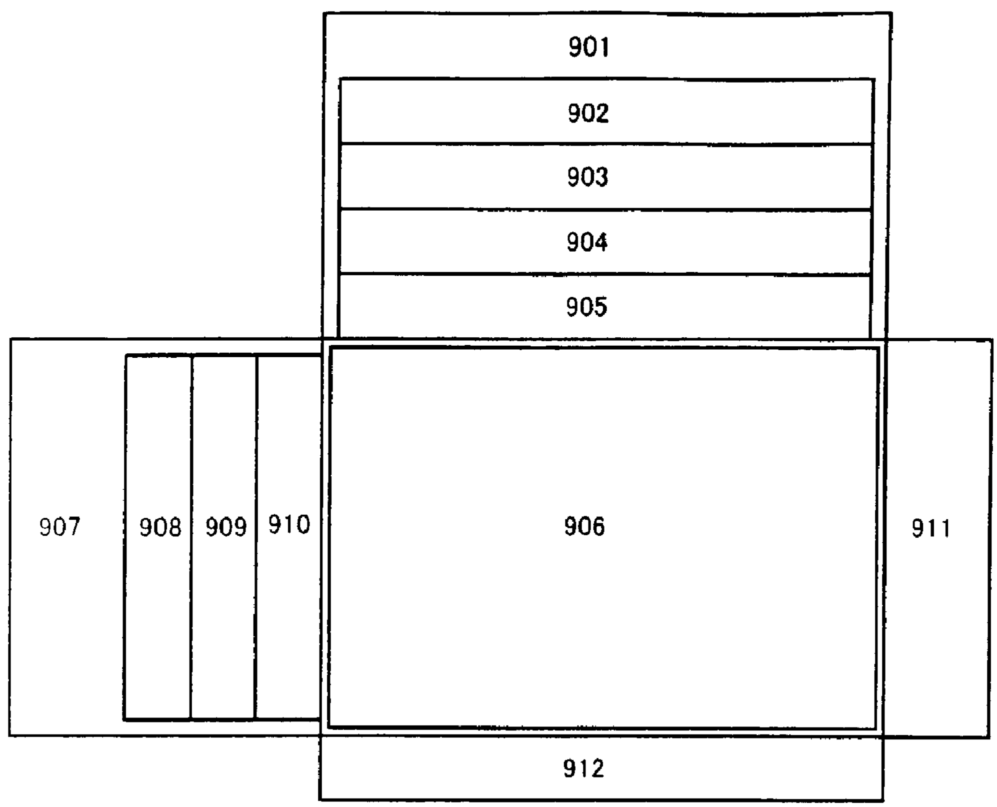
FIG. 11 is a circuit block diagram.

Next, an example of the circuit structure of the active matrix type liquid crystal display of FIG. 10 will be shown in FIG. 11. The active matrix type liquid crystal display in this embodiment includes a picture signal driving circuit

901, a gate line side driving circuit (A) 907, a gate line side driving circuit (B) 911, a precharge circuit 912, and a pixel circuit 906. In this specification, the source line side driving circuit 901 and the gate line side driving circuit 907 are included in the driving circuit.

The source line side driving circuit 901 includes a shift register circuit 902, a level shifter circuit 903, a buffer circuit 904, and a sampling circuit 905. The gate line side driving circuit (A) 907 includes a shift register circuit 908, a level shifter circuit 909, and a buffer circuit 910. The gate line side driving circuit (B) 911 is constructed in the same manner.

As mentioned above, the present invention can realize a semiconductor device that includes at least a pixel circuit and a driving circuit for controlling the pixel circuit on the same substrate, for example, a semiconductor device that includes a signal processing circuit, a driving circuit, and a pixel circuit on the same substrate.

Additionally, if the processes described until FIG. 2(A) in this embodiment are conducted, there is formed a crystalline silicon film of a peculiar crystal structure with continuity in a crystal lattice. A broad description will be provided hereinafter of a feature of the crystal structure which the present applicant experimentally has studied. This feature coincides with a feature of the semiconductor layer forming the active layer of the TFT that has been completed by this embodiment.

Further, it has been verified by using electron beam diffraction and x-ray diffraction that the principal orientation face is {110} on the surface of the active layer (the channel forming portion), although there is some crystal axis deviation. When analysis is performed by using electron beam diffraction it is found that the diffraction spot appeared cleanly in correspondence to the {110} face. Further, it is visible that each spot had a concentric distribution.

Furthermore, when the crystal grain boundaries formed by contact of each of bar-like crystals is observed by using an HR-TEM (high resolution transmission electron microscope), it is confirmed that the crystal lattice has continuity in the grain boundaries. This was easily verified by the continuous connection of the observed lattice stripes in the grain boundaries.

Note that the continuity of the crystal lattice in the crystal grain boundaries originates in the fact that the crystal grain boundaries are grain boundaries that are referred to as "planar boundary." The definition of the planar boundary in this specification is 'planar boundary' described in "Characterization of High-Efficiency Cast-Si Solar Cell Wafers by MBIC Measurement, Ryuichi Shimokawa and Yutaka Hayashi, Japanese Journal of Applied Physics vol. 27, No. 5, pp. 751–8, 1988."

According to the above paper, planar boundary include twin crystal grain boundaries, special stacking faults, special twist grain boundaries, etc. This planar boundary possesses a characteristic in that it is not electrically active. Namely, the crystal grain boundaries can essentially be seen as non-existent because they do not function as a trap that obstructs the movement of a carrier.

Particularly for cases in which the crystal axis (the axis perpendicular to the crystal face) is the <110> axis, {211} twin crystal grain boundaries is also referred to as grain boundaries corresponding to Σ3. The Σ value is a parameter that indicates the degree of matching in corresponding grain boundaries, and it is known that smaller Σ values signify good grain boundary matching.

When a crystalline silicon film of the present embodiment is actually observed in detail by using TEM, it is found that most of the crystal grain boundaries (more than 90%, typically more than 95%) had grain boundaries corresponding to Σ3, typically, {211} twin grain boundaries.

In a crystal grain boundary formed between 2 crystal grains, it is known that the grain boundary becomes a grain boundary corresponding to Σ3 when an angle θ between lattice stripes corresponding to {111} plane is 70.5°, in case that plane orientation of both crystals are {110}. Each lattice stripe of the neighboring crystal boundaries is continued at an angle of 70.5° in the crystal grain boundary of a crystalline silicon film of the present embodiment, and accordingly it can be said that the crystal grain boundaries are grain boundaries corresponding to Σ3.

Note that a grain boundary is grain boundary correspond to Σ9 when θ=38.9°, and other crystal grain boundaries like this also exist. In any case, there is no difference to the fact that it is inactive.

This type of corresponding grain boundary is only formed between crystal grains in the same face orientation. In other words, the crystalline silicon film obtained in the present embodiment has a face orientation roughly matched to {110}, and therefore this corresponding grain boundary is formed over a wide range.

This type of crystal structure (literally, crystal grain boundary structure) shows that two different crystal grains are joined together with very good matching in the grain crystal boundaries. Namely, it is a structure in which crystal lattice is continuously joined in the crystal grain boundaries, and in which a trap level caused by crystal defects, etc are scarcely formed. Therefore it is possible to regard the semiconductor thin films having this type of crystal structure as ones in which crystal grain boundaries do not substantially exist.

Further, it has been verified by TEM observation that defects within the crystal grain almost completely disappear with a heat treatment process (a thermal oxidation process in this embodiment) at a high temperature of 800 to 1150° C. It is also clear from the fact that the number of defects is greatly decreased after the heat treatment process.

The difference in the number of defects appears as the difference in spin density by electron spin resonance (ESR). At present, it is found that crystalline silicon films of the present embodiment have a spin density at least $5\times10^{17}$ spins/cm$^3$ or less (preferably $3\times10^{17}$ spins/cm$^3$ or less). However, this measurement value is near the detection limits of the present measuring equipment, and it is expected that the actual spin density is even lower.

From the above, the crystalline silicon film of the present embodiment may be regarded as a single crystal silicon film or an essentially single crystal silicon film because the number of defects in a crystal grain is notably small and the crystal grain boundaries do not substantially exist.

Embodiment 2

Embodiment 1 showed an example in which a catalyst element that promotes crystallization is used as a method of forming a semiconductor film that has a crystal structure. However, Embodiment 2 shows an example in which, without using such a catalyst element, a semiconductor film that has a crystal structure is formed by heat crystallization or laser crystallization.

In the heat crystallization, heat treatment at 600–650° C. for 15–24 hours can be conducted after forming a semiconductor film that shows an amorphous structure. In other words, a natural nucleus is generated by conducting the heat treatment at a temperature exceeding 600° C., and crystallization progresses.

In the laser crystallization, laser annealing can be conducted after forming a semiconductor film that has an amorphous structure. Thereby, a semiconductor film that has a crystal structure can be formed in a short time. Lamp annealing can be conducted instead of the laser annealing, of course. In addition, a glass substrate or a plastic substrate instead of the quartz substrate can be used as a substrate.

It is also effective to continuously form a base film and an amorphous silicon film on a substrate without air release. Thereby, the contamination of the surface of the substrate is allowed to exert no influence upon the amorphous silicon film, and, further, the characteristic variability of a TFT to be formed can be decreased.

Thus, a semiconductor film that contains a crystal structure used in the present invention can be formed by every known means.

Embodiment 3

This embodiment shows an example in which a contact hole is formed by a method different from that of Embodiment 1. In this embodiment, the contact hole is formed after activation, a second interlayer insulating film is then piled, and a contact hole is formed by again conducting patterning. Since a basic structure thereof is almost similar to that of Embodiment 1, a description is provided paying attention only to the difference.

Figure 3A:
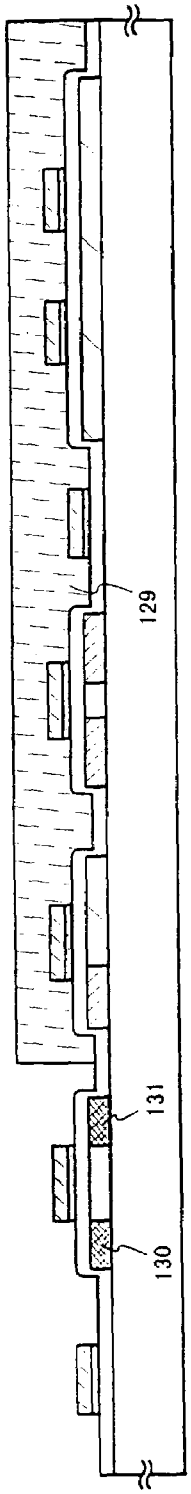
FIGS. 3(A) to 3(D) are views showing a manufacturing step of the AM-LCD.
Figure 3B:
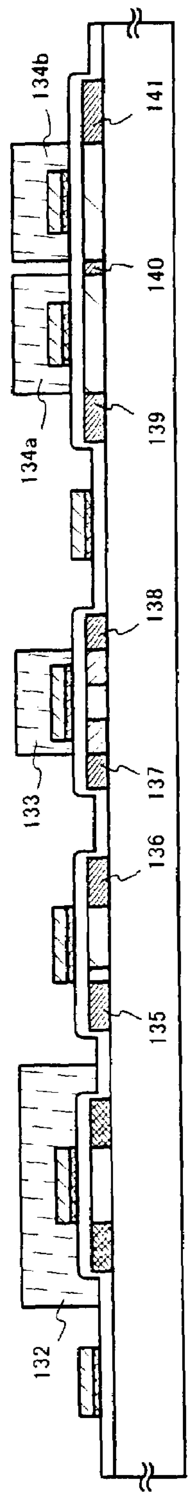
Figure 3C:
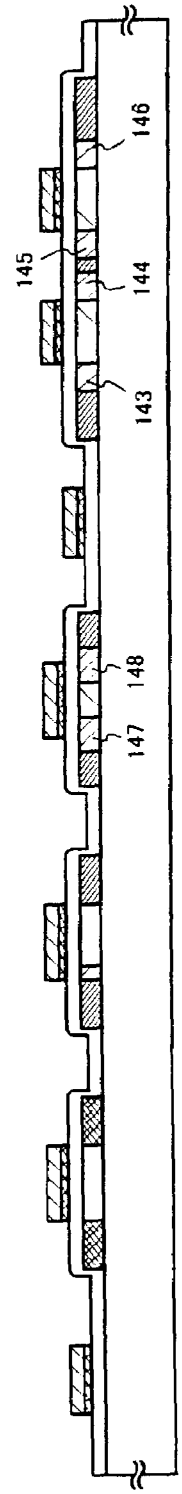
Figure 3D:
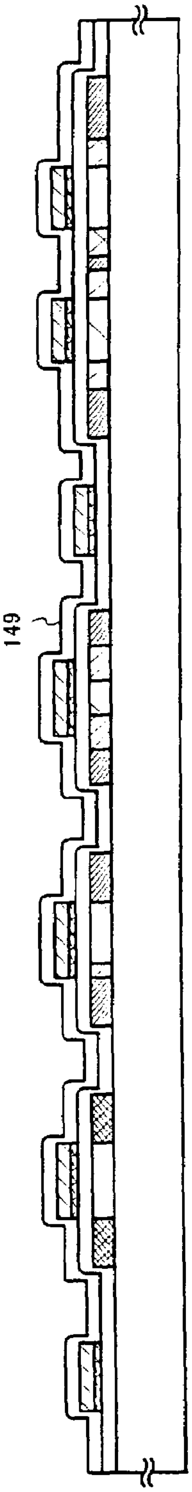

A first interlayer insulating film 149 is first piled according to Embodiment 1, activation is then conducted, and the state of FIG. 3(D) is obtained. A view corresponding to FIG. 3(D) is shown in FIG. 12(A).

Thereafter, a contact hole that reaches a source region or a drain region is formed. The gate insulating film and the first interlayer insulating film are etched simultaneously or sequentially by using the same mask. (FIG. 12(B)) If dry etching is conducted as the etching at this time, a minute contact hole (0.5 $\mu$m–1.5 $\mu$m) can be formed.

Figures 12A, 12B, 12C, 12D:
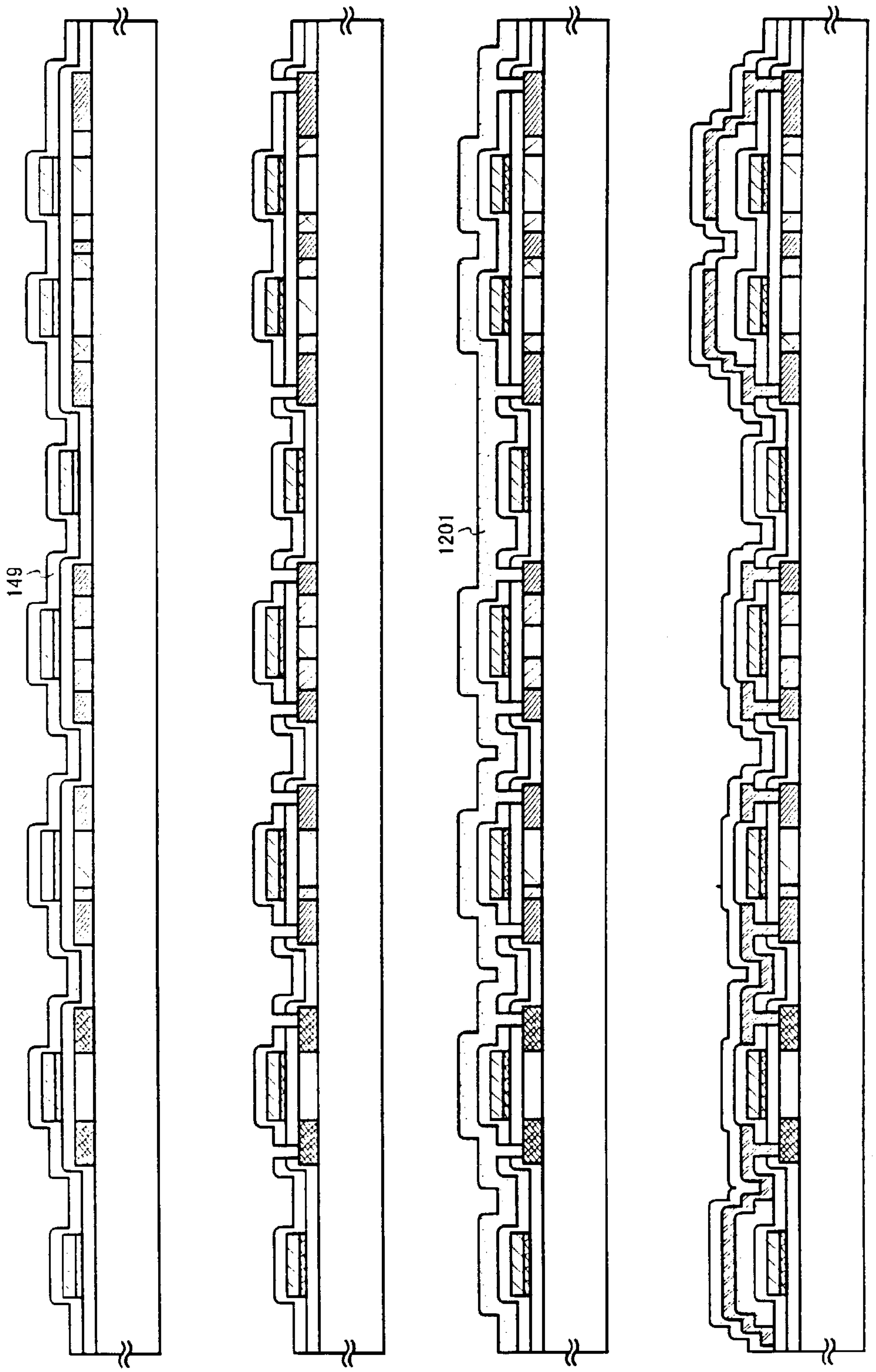
FIGS. 12(A) to 12(D) are views showing a manufacturing step of the AM-LCD.

Thereafter, a second interlayer insulating film 1201 is piled, and the state of FIG. 12(C) is obtained. An insulating film that has the same composition as in Embodiment 1 is used as the second interlayer insulating film. Thereafter, patterning is applied to the second interlayer insulating film 1201, and a source wiring and a drain wiring are formed as in Embodiment 1, and, as a result, the state of FIG. 12(D) that corresponds to FIG. 4(C) of Embodiment 1 is obtained. In the patterning of the second interlayer insulating film, a taper shape is obtained by wet etching, and therefore the coverage of the source wiring and the drain wiring formed thereon becomes excellent. A description of the subsequent processes is omitted because they are each the same as in Embodiment 1.

Thus, the first and second interlayer insulating films, which are different in film quality, are individually etched in this embodiment, and therefore it is possible to form a contact hole excellent in shape and small in over etching. This makes it possible to perform reliable contact connection and improve yields.

The configuration of this embodiment can be freely combined with that of Embodiment 1 or Embodiment 2.

Embodiment 4

This embodiment shows an example in which the patterning of a gate insulating film is conducted after the patterning of a gate electrode, and the formation of a contact hole is facilitated. Since the basic configuration thereof is almost similar to that of Embodiment 1, a description is provided paying attention only to the difference.

Figures 13A, 13B, 13C, 13D:
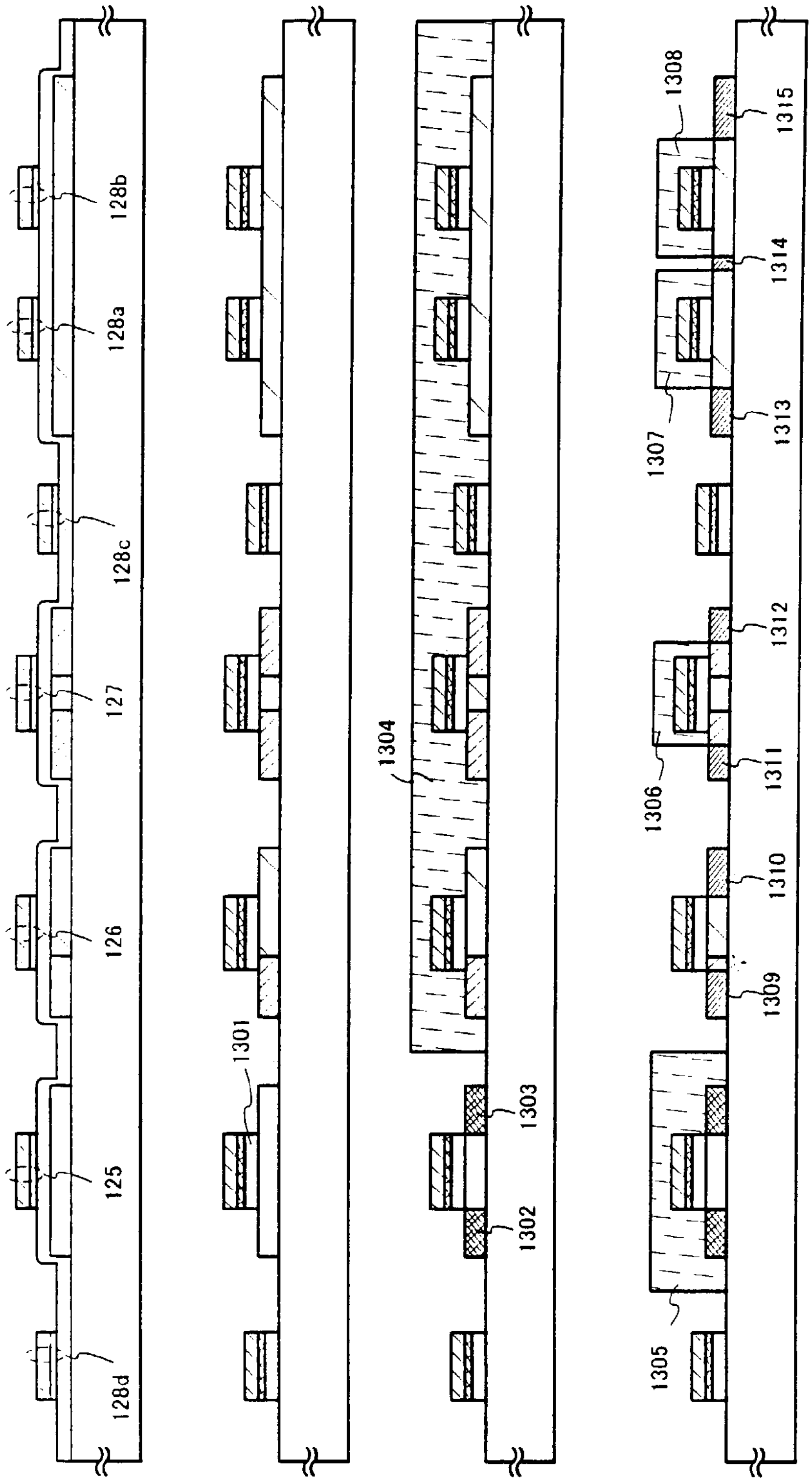
FIGS. 13(A) to 13(D) are views showing a manufacturing step of the AM-LCD.

First of all, the state of FIG. 2(E) is obtained according to Embodiment 1. A view corresponding to FIG. 2(E) is shown in FIG. 13(A).

Thereafter, with a gate electrode as a mask, etching is conducted to form a gate insulating film 1301. (FIG. 13(B)) Thereafter, the doping of a p-type impurity element is conducted using a resist mask 1304, and then p-type impurity regions (a) 1302,1303 added to the same concentration as in Embodiment 1 are formed. However, it is necessary to establish a doping condition different from that of Embodiment 1 because the doping is conducted in a state where an active layer is exposed. (FIG. 13(C))

Thereafter, the resist mask 1304 is removed, and resist masks 1305–1308 are formed. The doping of an n-type impurity element is then conducted using the resist masks 1305–1308 so as to from n-type impurity regions (a) 1309–1315 added to the same concentration as in Embodiment 1. However, a performer of the present invention must establish a doping condition different from that of Embodiment 1 because the doping is conducted in a state where an active layer is exposed. (FIG. 13(D))

Thereafter, the resist masks 1305–1308 are removed, and, with the gate electrode as a mask, the doping of the n-type impurity element is conducted so as to form n-type impurity regions (c) 1401–1404 added to the same concentration as in Embodiment 1. However, the performer of the present invention must establish a doping condition different from that of Embodiment 1 because the doping is conducted in a state where an active layer is exposed. (FIG. 14(A))

Thereafter, a first interlayer insulating film 1405 is formed in the same way as in Embodiment 1, and activation processing is conducted. (FIG. 14(B)) It should be noted that the first interlayer insulating film is required to have a minimum film thickness for protecting the active layer because there is a part where the active layer is covered only with the first interlayer insulating film in this embodiment. In this situation, the first interlayer insulating film can be, representatively, 50–200 nm thick.

Thereafter, a second interlayer insulating film 1406 is formed in the same way as in Embodiment 1. (FIG. 14(C)).

Thereafter, the first and second interlayer insulating films are etched simultaneously or sequentially in the same way as in Embodiment 1 so as to form a contact hole that reaches a source region or a drain region. A source wiring and a drain wiring are then formed. (FIG. 14(D)) Since the subsequent processes are the same as in Embodiment 1, a description of them is omitted.

In this embodiment, an example was shown in which the gate insulating film is etched immediately after the gate wiring is formed. Herein, if the process of removing the gate insulating film is performed from immediately after the formation of the gate wiring until before the formation of the second interlayer insulating film, no problem will arise.

Thus, since the number of piled layers of an insulating film to be holed can be decreased, yields can be improved. Herein, it is necessary to consider the etching rate of the first and second interlayer insulating films as in Embodiment 1.

The configuration of this embodiment can be set up by freely combining those of Embodiments 1–3 with each other.

Embodiment 5

In this embodiment, a description is provided of a case where the present invention is applied to a semiconductor, device made on a silicon substrate. Typically, the present invention is applicable to a reflection type liquid crystal display that uses a high-reflectance metal film as a pixel electrode.

In this embodiment, a silicon substrate (silicon wafer) is used as the substrate of Embodiment 1. An impurity region, such as an LDD region, a source region or a drain region, is formed by directly adding an n-type or p-type impurity element to the silicon substrate. In this case, the forming order of the respective impurity regions or that of the gate insulating films is out of consideration.

The configuration of this embodiment can be freely combined with any configuration of Embodiments 1–4. However, since a semiconductor layer that serves as an active layer is, as established, a single-crystal silicon substrate, they are combined in processes other than a crystallizing process.

Embodiment 6

The present invention can also be used when an interlayer insulating film is formed on a conventional MOSFET, and then a TFT is formed thereon. That is, it is also possible to realize a semiconductor device of a three-dimensional structure. Additionally, it is also possible to use a SOI substrate, such as SIMOX, Smart-Cut (registered trademark of SOITEC Co.), and ELTRAN (registered trademark of Canon Inc.), as a substrate.

The configuration of this embodiment can be freely combined with any one of Embodiments 1–5.

Embodiment 7

In this embodiment, a description is provided of a case where the present invention is applied to a semiconductor device in which a memory portion and a driving circuit are integrally formed on the same substrate.

Figure 15:
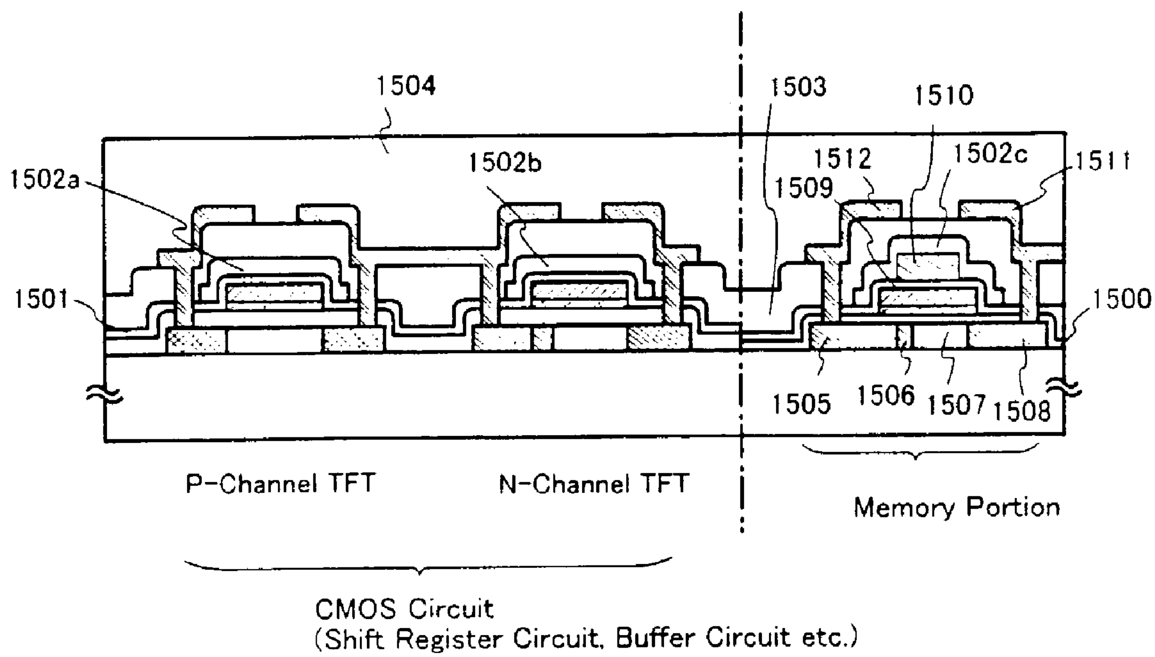
FIG. 15 is a view showing a structure of a memory portion and a CMOS circuit.

The memory portion is formed with a nonvolatile memory (herein, EEPROM). In FIG. 15, a memory transistor (also called a memory cell transistor) formed in the memory cell is illustrated. In practice, a plurality of memory cells are integrated and form the memory portion. Herein, a description is provided citing a flash memory (flash EEPROM) with a high integration.

The memory transistor is comprised of a source region 1505, a drain region 1508, an active layer that includes a low-concentration impurity region (also called LDD region) 1505 and a channel formation region 1507, a gate insulating film 1500, a first interlayer insulating film 1501, a second interlayer insulating film 1502*c*, a floating gate electrode 1509, a third gate insulating film 11, a control gate electrode 1510, a common source wiring 1512 formed through the medium of the third interlayer insulating film 1503, and a bit wiring 1511 (drain wiring).

The source region 1505 is a region for pulling out a carrier (electron) captured by the floating gate electrode 1509 to the common source wiring 1512. The source region 1505 can be called a deleting region. Though the LDD region 1506 is placed between the channel formation region 1507 and the source region 1505 in FIG. 15, the region 1506 is not necessarily required to be formed. The drain region 1508 is a region for injecting the carrier into the floating gate electrode 159 isolated electrically. The drain region 1508 can be called a writing region. The drain region 1508 functions also as a reading region for reading the data stored in the memory transistor to the bit wiring 1511.

It is necessary to, as the gate insulating film 1500, use a thin insulating film (3–20 nm thick, preferably, 5–10 nm thick) to such an extent that a tunneling current (Fowler-Nordheim current) runs. Therefore, it is preferable to use an oxide film obtained by oxidizing an active layer (if the active layer is silicon, a silicon oxide film is used). Of course, the first gate insulating film can be formed according to the vapor phase method, such as CVD method or sputtering method, as long as the film thickness thereof has good uniformity.

In this embodiment, a parasitic capacitance generated at an overlap where the gate electrode 1510 overlaps with the bit wiring 1511 or the common source wiring 1512 is decreased by the second interlayer insulating film 1502*c*.

A CMOS circuit is shown as a concrete instance that forms a driving circuit portion. In practice, the CMOS circuit is made a basic circuit, and a logic circuit, such as a flip-flop circuit, is formed. They are integrated so as to form the driving circuit portion. Also in the CMOS circuit, the second interlayer insulating films 1502*a*, 1502*b* are provided to decrease the parasitic capacitance of the gate wiring and the upper layer wiring.

As mentioned above, the present invention is applicable to various semiconductor devices.

The configuration of this embodiment can be freely combined with any one of Embodiments 1–6.

Embodiment 8

Figure 16:
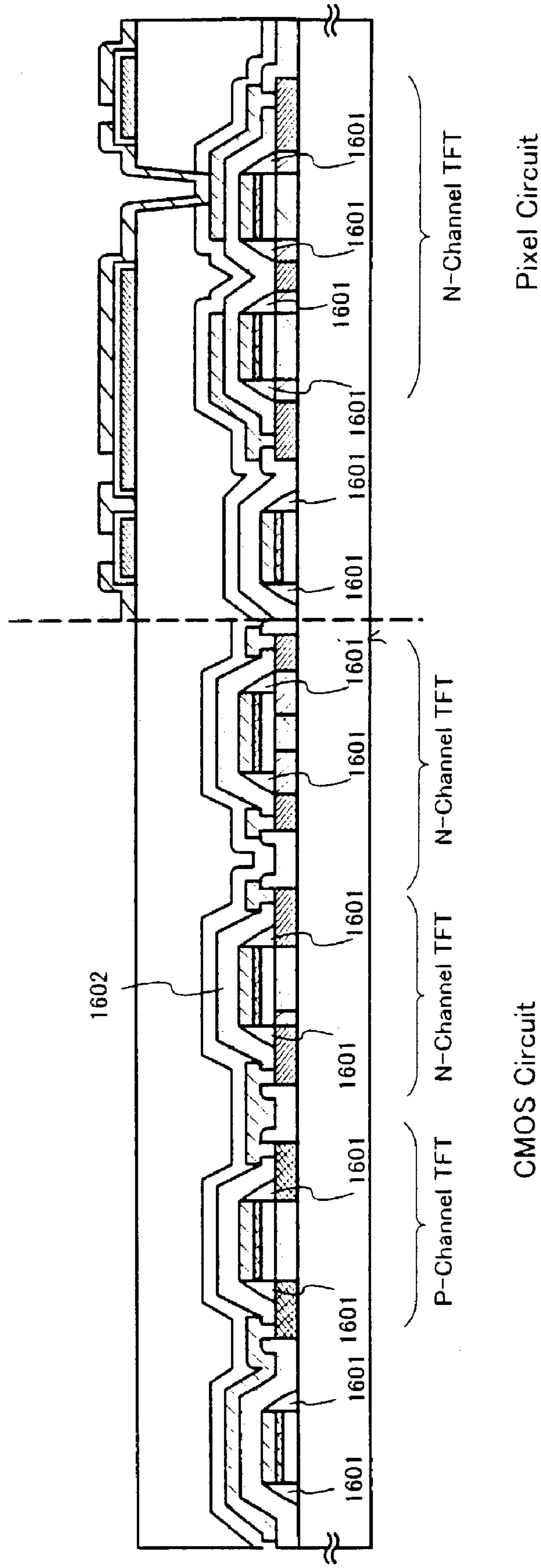
FIG. 16 is a view showing a structure of a pixel circuit and the CMOS circuit.

This embodiment shows an example in which anisotropic etching is performed. Since the basic configuration thereof is almost similar to that of Embodiment 1 or Embodiment 3, a description is provided with reference to FIG. 16, paying attention only to the difference.

Figures 14A, 14B, 14C, 14D:
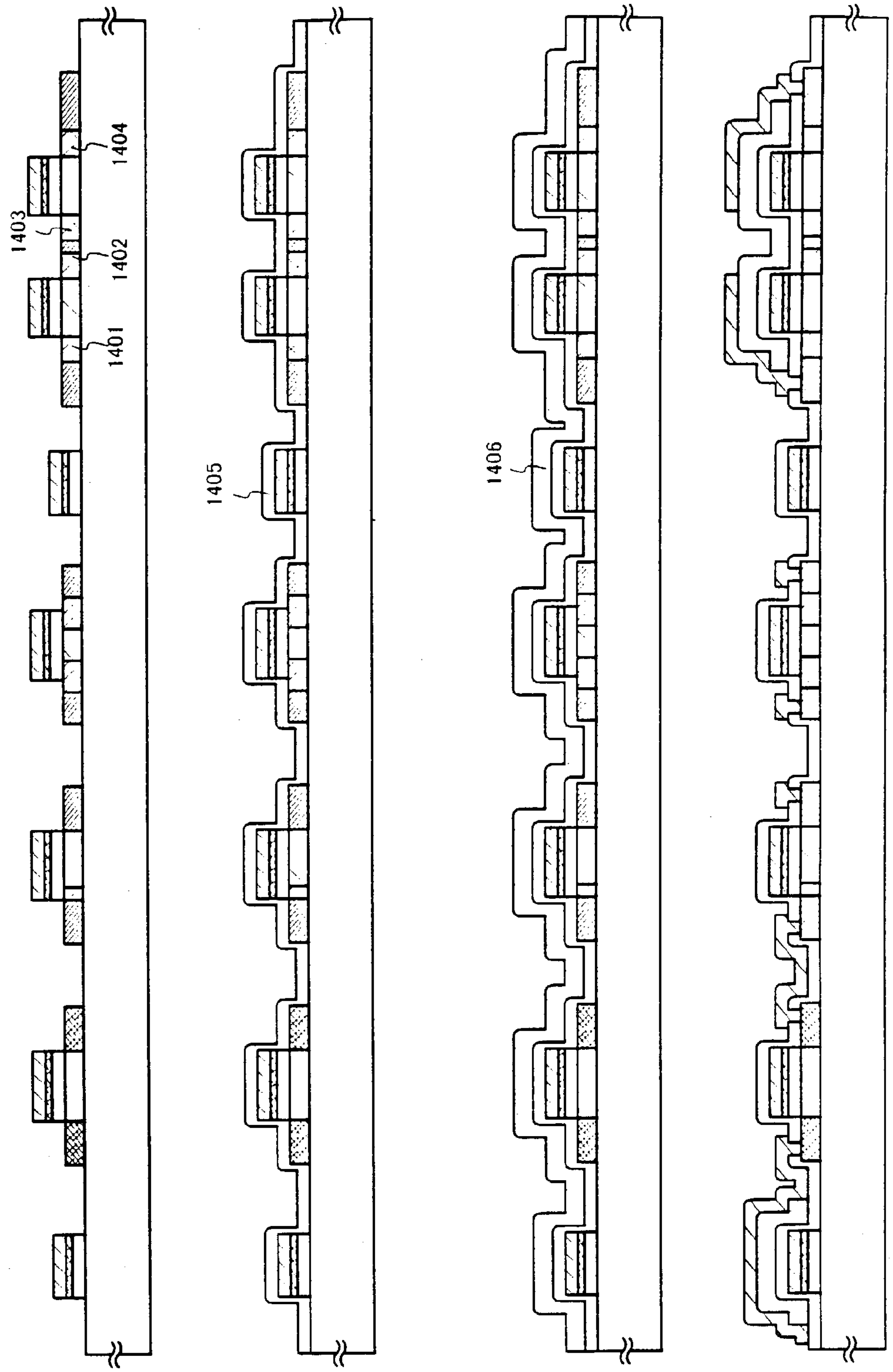
FIGS. 14(A) to 14(D) are views showing a manufacturing step of the AM-LCD.

In this embodiment, with a gate electrode as a mask, the gate insulating film is etched as in Embodiment 3, a first interlayer insulating film is then formed, and activation is conducted to obtain the same state as FIG. 14(B).

Thereafter, anisotropic etching is applied to the first interlayer insulating film, and a triangular insulator 1601 is formed at both sides of the gate electrode. In this case, it is preferable to beforehand form a protective film (not shown) for protecting the gate wiring.

Thereafter, a second interlayer insulating film 1602 is formed. Subsequently, the second interlayer insulating film is etched, a contact hole that reaches a source region or a drain region is then formed, and a source wiring and a drain wiring are formed. Since the subsequent processes are the same as Embodiment 1, a description thereof is omitted.

Thus, the number of piled layers of an insulating film to be holed can be decreased, and therefore the formation of the contact hole is simplified, and yields are improved.

The aforementioned process can be replaced with a process in which the triangular insulator 1601 is formed immediately after the gate electrode is formed, and thereby an impurity region, such as LDD region, is formed.

The configuration of this embodiment can be freely combined with any one of Embodiments 1–7.

Embodiment 9

Figure 17:
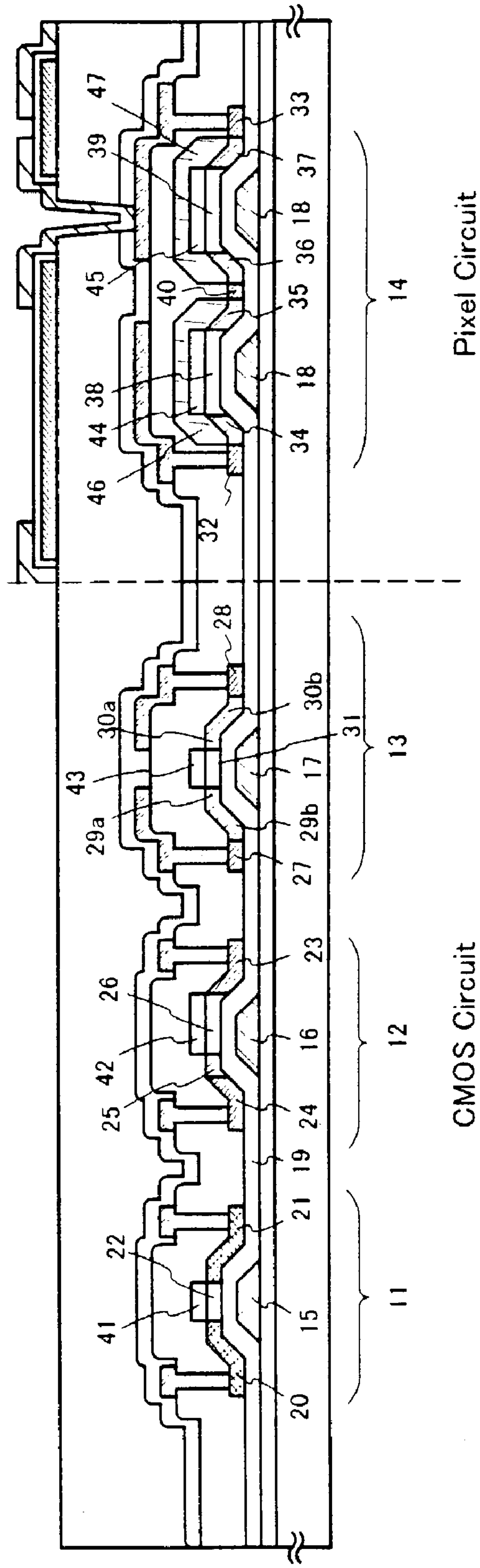
FIG. 17 is a view showing a structure of the pixel circuit and the CMOS circuit.

In this embodiment, a description is provided of a case in which the present invention is applied to a bottom gate type TFT. Specifically, a case in which the present invention is applied to an inversed-stagger type TFT is shown in FIG. 17. The inversed-stagger type TFT of the present invention does not differ very significantly from the top gate type TFT of Embodiment 1 except that a gate wiring and an active layer are different from each other in a positional relationship. Therefore, in this embodiment, a description is provided paying attention to a respect that is greatly different from the structure shown in FIG. 5, and a description of the other respects is omitted because they are the same as FIG. 5. As in Embodiment 1, second interlayer insulating films 46, 47 are formed to decrease a parasitic capacitance. The second interlayer insulating film is formed by the method described in Embodiment 1.

In FIG. 17, reference characters 11 and 12 designate a p-channel type TFT of a CMOS circuit that forms a shift register circuit etc., and an n-channel type TFT, respectively. 13 designates an n-channel type TFT that forms a sampling circuit etc., and 14 designates an n-channel type TFT that forms a pixel circuit. These are formed on a substrate provided with a base film.

Reference character 15 is a gate wiring of the p-channel type TFT 11, 16 is a gate wiring of the n-channel type TFT 12, 17 is a gate wiring of the n-channel type TFT 13, and 18 is a gate wiring of the n-channel type TFT 14. They can be formed by the same material as the gate wiring described in Embodiment 1. Additionally, 19 is a gate insulating film, which can also uses the same material as in Embodiment 1.

Active layers of the respective TFTs 11–14 are formed thereon. Preferably, when forming a semiconductor film of a gate insulating film and an active layer, the semiconductor film is continuously formed, without exposing it to air, according to the sputtering method or the PCVD method. A source region 20, a drain region 21, and a channel formation region 22 are formed in the active layer of the p-channel type TFT 11.

A source region 23, a drain region 24, an LDD region (in this case, Lov region 25), and a channel formation region 26 are formed in the active layer of the n-channel type TFT 12.

A source region 27, a drain region 28, an LDD region (in this case, Lov regions 29*a*, 30*a*, Loff regions 29*b*, 30*b*), and a channel formation region 3 1 are formed in the active layer of the n-channel type TFT 13.

A source region 32, a drain region 33, an LDD region (in this case, Loff regions 34–37), a channel formation regions 38, 39, and $n^+$ region 40 are formed in the active layer of the n-channel type TFT 14.

It is noted that the insulating films designated by reference characters 41–45 are formed for the purpose of protecting the channel formation region and for the purpose of forming the LDD region.

As mentioned above, it is easy to apply the present invention to the bottom gate type TFT typified by the reverse-stagger type TFT. When forming the reverse-stagger type TFT of this embodiment, the forming process described in the other embodiments in this specification can be applied to a known reverse-stagger type TFT forming process.

The configuration of this embodiment can be freely combined with any one of Embodiments 1–8.

Embodiment 10

The present invention is applicable also to an active matrix type EL (electro-luminescence) display. This is shown in FIG. 18.

Figure 18:
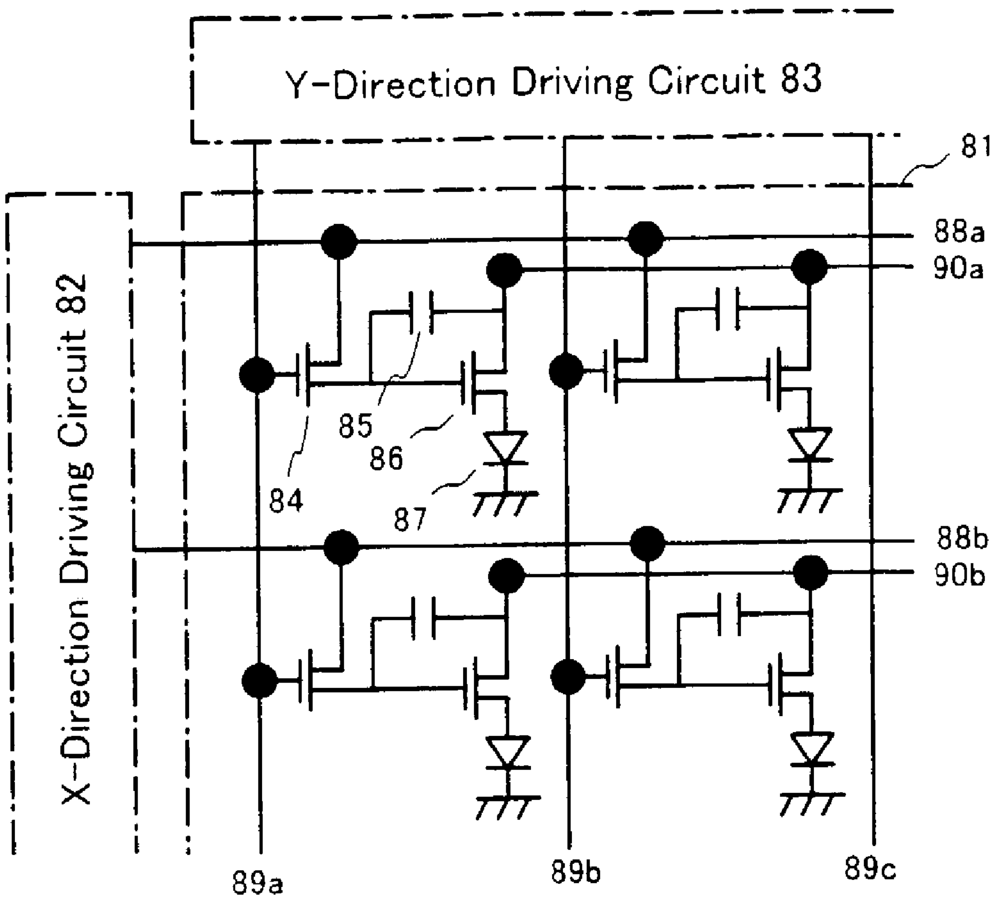
FIG. 18 is a view showing a structure of an active matrix type EL display.

FIG. 18 is a circuit diagram of the active matrix type EL display Reference character 81 designates a pixel circuit. An X direction driving circuit 82 and a Y direction driving circuit 83 are disposed therearound. Each pixel of the pixel circuit 81 has a switching TFT 84, a capacitor 85, a current control TFT 86, and an organic EL element 87. An X direction signal line 88*a* (or 88*b*) and a Y direction signal line 89*a* (or 89*b*, 89*c*) are connected to the switching TFT 84. Power lines 90*a*, 90*b* are connected to the current control TFT 86.

In the active matrix type EL display of this embodiment, a TFT used for the X direction driving circuit 82, the Y direction driving circuit 83, or the current control TFT 86 is formed with a combination of the p-channel type TFT 301 and the n-channel type TFT 302 or 303 of FIG. 5. A TFT of the switching TFT 84 is formed with the n-channel type TFT 304 of FIG. 5.

The active matrix type EL display of this embodiment can be combined with any configuration of Embodiments 1–9.

The above stated crystalline silicon film has a crystal structure in which a plurality of needle-like or column-like crystals are gathered and placed side by side, when seen microscopically. This is easily confirmed by observation using a TEM (transmission electron microscope).

Embodiment 11

It is possible to use various liquid crystal materials in a liquid crystal display device fabricated in accordance with the present invention. TN liquid crystal, PDLC (polymer dispersion liquid crystal), FLC (ferroelectric liquid crystal), AFLC (anti-ferroelectric liquid crystal), or a mixture of FLC and AFLC are given as examples of such materials.

For example, usable liquid crystal material includes ones disclosed in: H. Furue et al, 1998, SID, "Characteristics and Driving Scheme of Polymer-Stabilized Monostable FLCD Exhibiting Fast Response Time and High Contrast Ratio with Gray-Scale Capability"; T. Yoshida et al., 1997, SID DIGEST, 841, "A Full-Color Thresholdless Antiferroelectric LCD Exhibiting Wide Viewing Angle with Fast Response Time"; and U.S. Pat. No. 5,594,569.

Specifically when antiferroelectric liquid crystal without threshold value (thresholdless antiferroelectric LCD: hereinafter referred to as TL-AFLC) is used, the supply voltage is sufficient at approximately 5 to 8 V in some cases because the driving voltage for the liquid crystal can be reduced to approximately ±2.5 V. In other words, driver circuits and pixel matrix circuits can be driven at same supply voltage, and low power consumption of the liquid crystal display device as a whole can be devised.

Further, some of the thresholdless-antiferroelectric liquid crystal show electro-optical response characteristics of V shape, and there has been found among them ones the driving voltage of which is about ±2.5 V (with cell thickness of about 1 m to 2 m).

Figure 19:
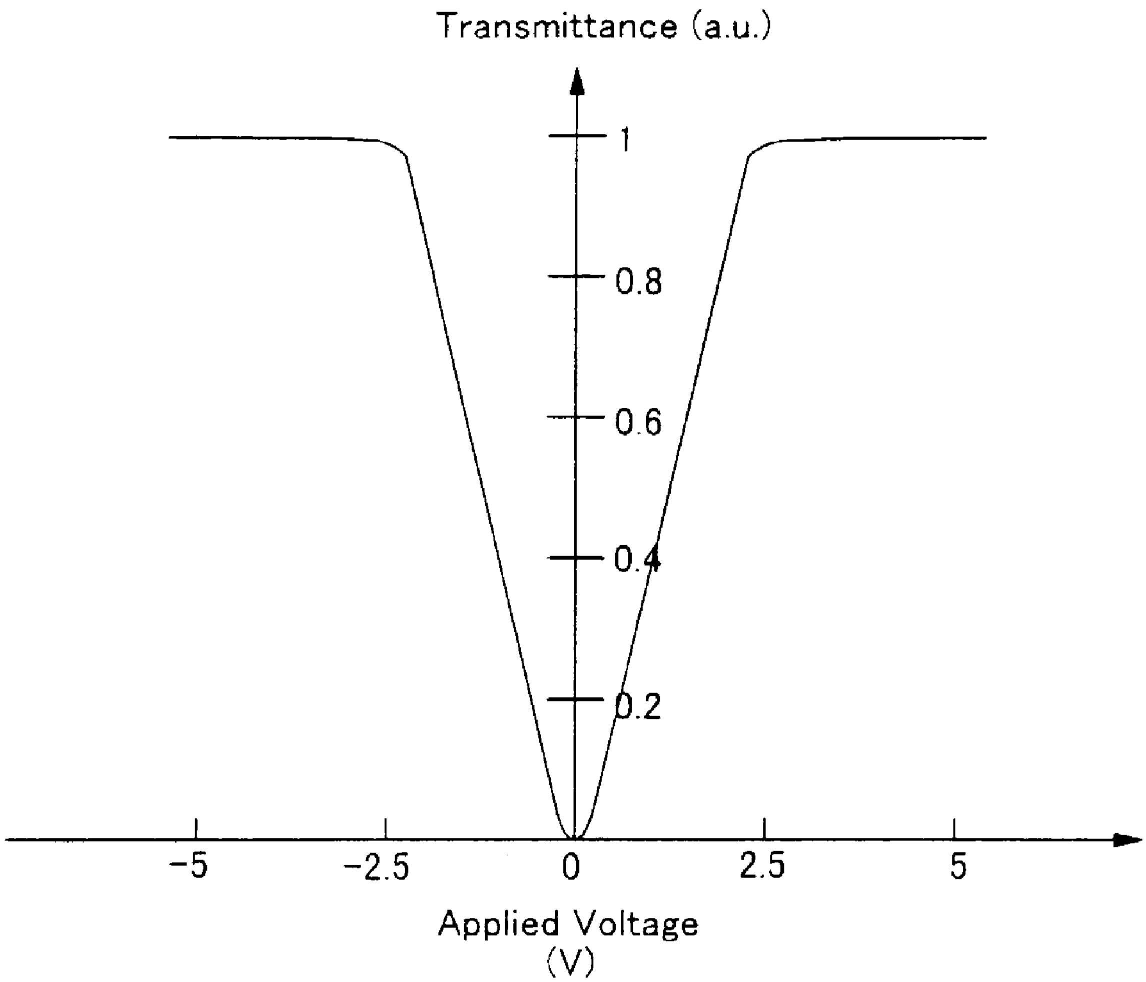
FIG. 19 is a graph showing the characteristic of a light transmittance to the applied voltage of a non-threshold anti-ferroelectricity mixed liquid crystal.

An example of characteristics in terms of its light transmittance with respect to the applied voltage of the thresholdless-antiferroelectric mixed liquid crystal that exhibits electro-optical response characteristics of V shape is shown in FIG. 19. In the graph shown in FIG. 19, the axis of the ordinate indicates transmittance (in arbitrary unit) and the axis of abscissa indicates applied voltage. A transmission axis of a polarizing plate on the incident side of a liquid crystal display device is set substantially in parallel with the normal line direction of a smectic layer of the thresholdless-antiferroelectric mixed liquid crystal which substantially coincides with the rubbing direction of the liquid crystal display device. Further, a transmission axis of the polarizing plate on the emission side is set so as to substantially form crossed Nicol to the transmission axis of the polarizing plate on the incident side.

A ferroelectric liquid crystal and anti-ferroelectric liquid crystal have an advantage in that they have faster response speed compared to TN liquid crystals. Because a crystalline TFT used in the above stated embodiments can materialize TFTs that have extremely fast operation speed, it is possible to realize a liquid crystal display device which has a fast image response speed in which the fast response speed of the ferroelectric liquid crystal and anti-ferroelectric liquid crystal is sufficiently utilized.

It is needless to say that it is effective to use a liquid crystal display device of the present embodiment as a display of electronic devices such as a personal computer, etc.

The constitution of this embodiment can be freely combined with any one of Embodiments 1 to 9.

Embodiment 12

An example of manufacturing an EL (electro-luminescence) display device by using the present invention is described in the present Embodiment. Note that FIG. 20A is a top view of an EL display device of the present invention and FIG. 20B shows its cross sectional structure.

Figure 20A:
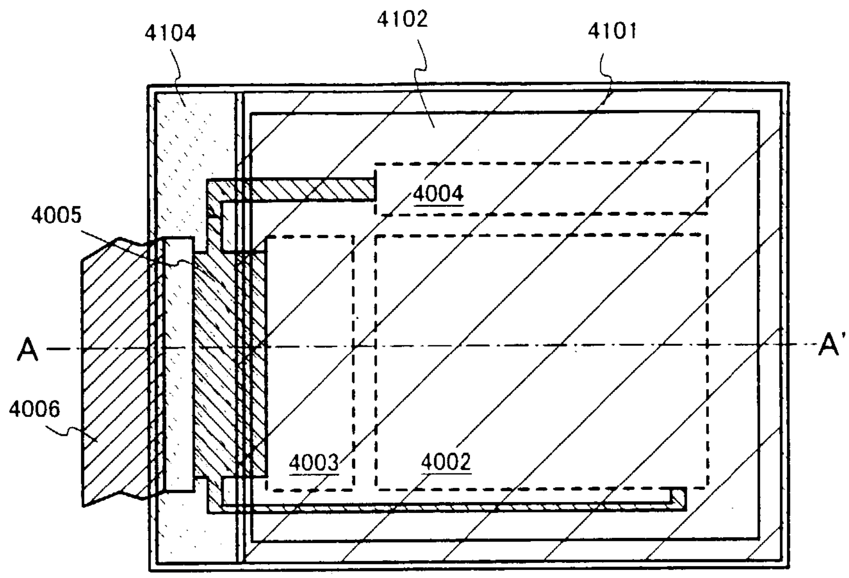
FIGS. 20(A) and 20(B) are a top view and a sectional view of the active matrix type EL display, respectively.

In FIG. 20A, reference numeral 4001 denotes a substrate; 4002, a pixel section; 4003, a source side driver circuit; 4004, a gate side driver circuit. Each driver circuit reaches FPC (flexible print circuit) 4006 through wiring 4005, and, then connected to external machines.

Here, a first sealing material 4101, a cover member 4102, a filling material 4103 and a second sealing material 4104 are disposed to surround a pixel section 4002, a source side driver circuit 4003 and a gate side driver circuit 4004.

Figure 20B:
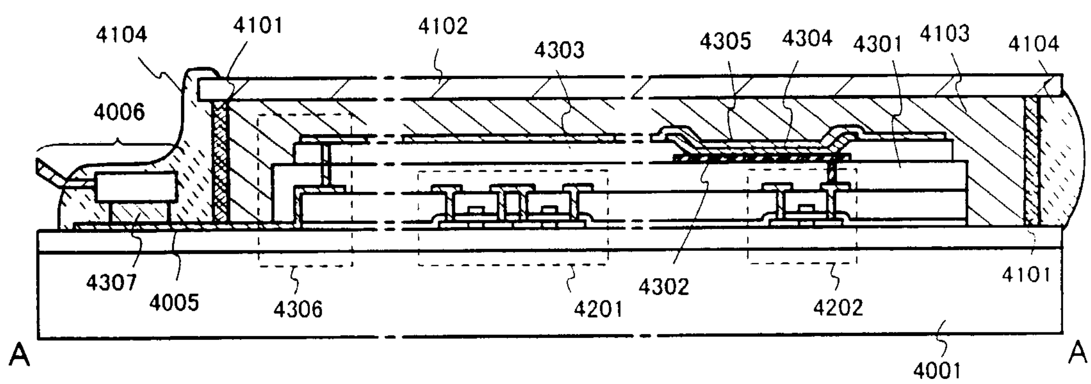

Further, FIG. 20B corresponds to a cross-sectional diagram at A–A' of FIG. 20A. A driver TFT 4201 which forms a source side driver circuit 4003 (note that an n-channel TFT and a p-channel TFT are shown in the figure) and a current control TFT (a TFT which controls electric current that flows into an EL element) 4202 which forms the pixel section 4002 are formed over a substrate 4001.

In the present embodiment a TFT which has the same structure as the p-channel TFT or the n-channel TFT in FIG. 5 is used for a driver TFT 4201; and a TFT which has the same structure as the p-channel TFT in FIG. 5 is used for a current control TFT 4202. Further, a storage capacitor (not shown) which is connected to the gate of a current control TFT 4202 is disposed in the pixel section 4002.

An interlayer insulating film (flattening film) 4301 comprising a resin material is formed over a driver TFT 4201 and a pixel TFT 4202, and a pixel electrode (anode) 4302 that is electrically connected to the drain of a pixel TFT 4202 is formed thereon. As a pixel electrode 4302, a transparent conductive film that has a large work function is used. A compound of indium oxide and tin oxide, a compound of indium oxide and zinc oxide, zinc oxide, tin oxide or indium oxide can be used as the transparent conductive film. In addition, a material added with gallium to the above stated transparent conductive film may also be used.

An insulating film 4303 is formed on the pixel electrode 4302 and an opening section is formed in the insulating film 4303 at above the pixel electrode 4302. In this opening section an EL (electro-luminescence) layer 4304 is formed over the pixel electrode 4302. A known organic or inorganic EL material can be used for the EL layer 4304. Further though there are small molecular materials and polymer materials in the organic EL materials, either may be used.

A known evaporation technique or a coating technique may be used for the formation method of the EL layer 4304. Further, the structure of EL layer may be a laminate structure or a single layer structure by freely combining a hole injection layer, a hole transport layer, a light emitting layer, an electron transport layer or an electron injection layer.

A cathode 4305 comprising a conductive film that includes an element which belongs to group 1 or 2 of the periodic table (typically a conductive film in which alkali metal element or alkali earth metal is included in aluminum, copper or silver) is formed on the EL layer 4304. It is preferable to avoid as much as possible of moisture and oxygen that exist in the interface between the cathode 4305 and the EL layer 4304. Accordingly measures such as successive deposition of the two in a vacuum, or forming EL layer 4304 in a nitrogen or noble gas atmosphere and then forming cathode 4305 without contact to oxygen and moisture, are required. In the present embodiment the deposition described above is made possible by using a deposition apparatus such as a multi-chamber system (cluster-tool system).

The cathode 4305 is electrically connected to the wiring 4005 in a region denoted by reference numeral 4306. Wiring 4005 is wiring for applying preset voltage to the cathode 4305 and is electrically connected to FPC 4006 through an anisotropic conductive film 4307.

Thus an EL element that comprises a pixel electrode (anode) 4302, an EL layer 4304 and a cathode 4305 is formed. The EL elements are surrounded by first sealing material 4101 and a cover member 4102 which is stuck to a substrate 4001 by the first sealing material 4101 and sealed by filling material 4103.

As the cover member 4102, a glass material, a metallic material (typically stainless steel), a ceramics material and a plastic material (including a plastic film) can be used. As a plastic material, FRP (fiberglass-reinforced plastics) plate, PVF (polyvinyl fluoride) film, Myler film, polyester film or acrylic resin film can be used. Further, a sheet having a structure in which aluminum foil is sandwiched by PVF film or Myler film can be used.

Note however, the cover member need to be transparent in case that radiation from EL elements is directed to the direction toward cover member. In such cases, a transparent substance such as a glass plate, a plastic plate, a polyester film or an acrylic film is used.

A ultraviolet ray curing resin or a thermosetting resin can be used as filling material 4103, and PVC (polyvinyl chloride), acrylic, polyimide, epoxy resin, silicone resin, PVB (polyvinyl butyral), or EVA (ethylene vinyl acetate) can be used. If a drying agent (preferably barium oxide) or a material that absorbs oxygen is formed on the inside of the filling material 4103, deterioration of EL elements can be prevented.

Further, spacers may be included within the filling material 4103. When the spacers are formed from barium oxide, it is possible to give the ability to absorb moisture to the spacers themselves. In addition, it is effective to provide a resin film over cathode 4305, as a buffer layer that releases pressure from the spacers in case of disposing the spacers.

The wiring 4005 is electrically connected to the FPC 4006 through anisotropic conductive film 4307. Wiring 4005 transmits signals that are sent to pixel section 4002, source side driver circuit 4003 and gate side driver circuit 4004 to FPC 4006, and is electrically connected to an external device by FPC 4006.

In the present embodiment a structure that thoroughly shields the EL elements from external atmosphere is employed in which second sealing material 4104 is provided so as to cover the exposed portions of first sealing material 4101 and a part of FPC 4006. An EL display device having the cross sectional structure of FIG. 20B is thus complete.

Figure 21:
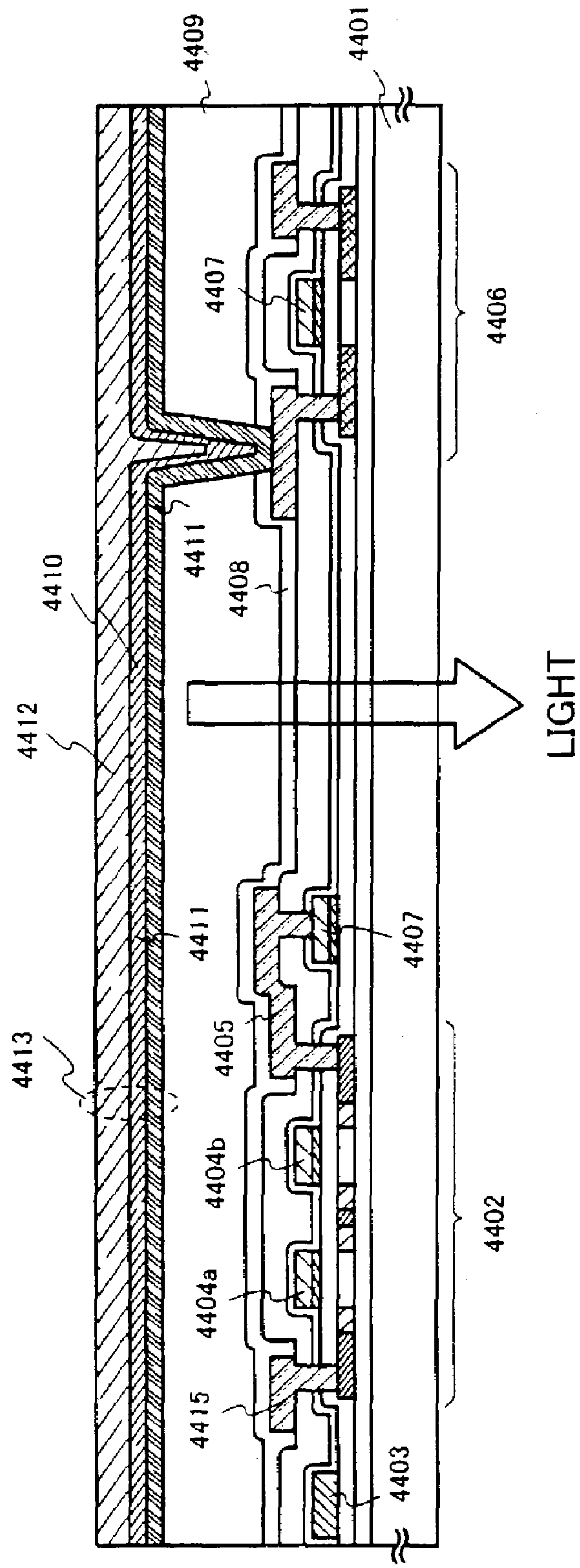
FIG. 21 is a sectional view showing a structure of a pixel of the active matrix type EL display.
Figure 22A:
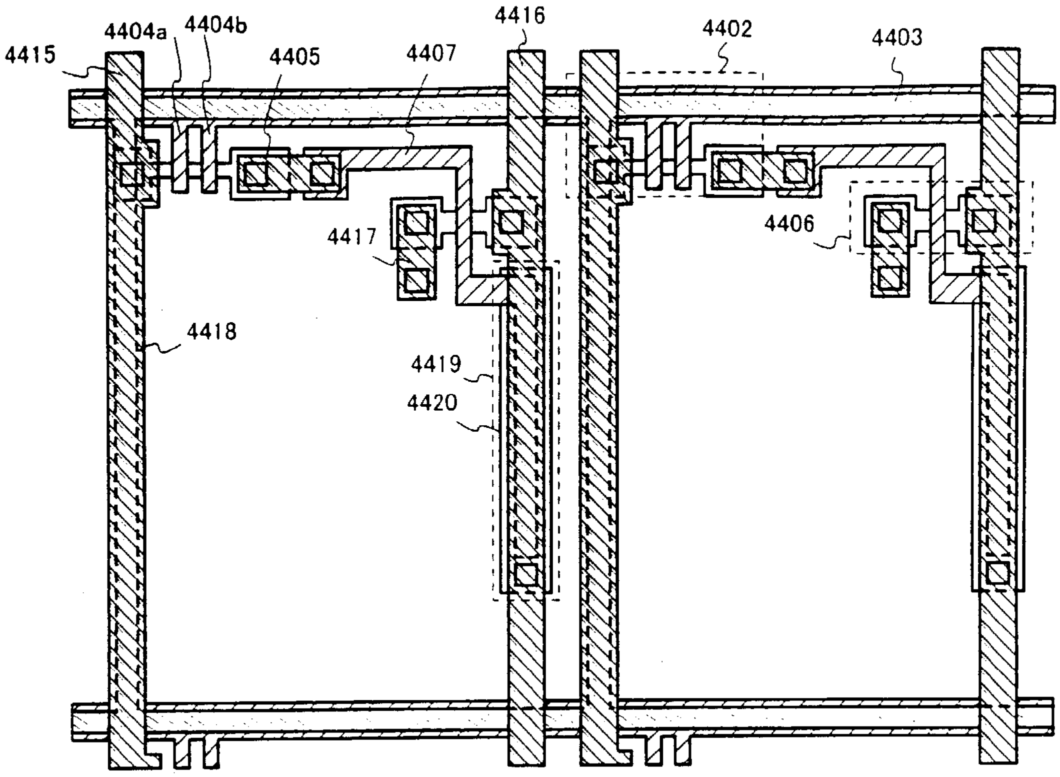
FIGS. 22(A) and 22(B) are top views showing the structure of the pixel of the active matrix type EL display.
Figure 22B:
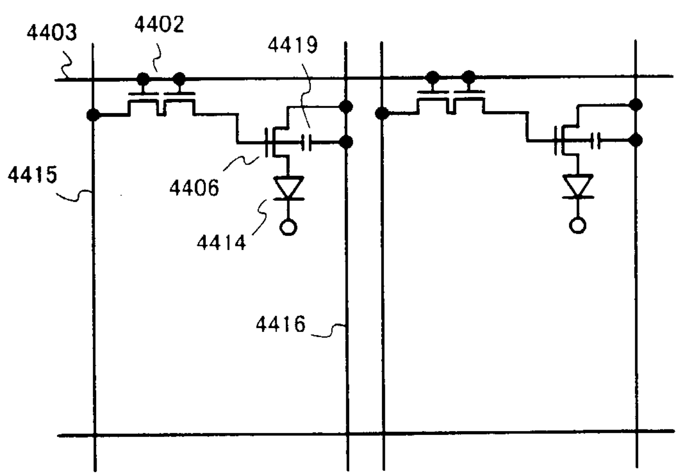

A more detailed structure on a cross section of pixel section is shown in FIG. 21, a top view is shown in FIG. 22A, and circuit diagram is shown in FIG. 22B. Common reference numerals are used in FIGS. 21, 22A and 22B, so that the figures may be compared with each other.

In FIG. 21, switching TFT 4402 disposed over substrate 4401 is formed from an n-channel TFT of FIG. 5. Accordingly the description of the n-channel TFT may be referred to, regarding the description of the structure. The wiring shown by 4403 is a gate wiring that electrically connects gate electrodes 4404*a* and 4404*b* of switching TFT 4402.

Note that while the present invention uses a double gate structure in which 2 channel forming regions are formed, single gate structure in which one channel forming region is formed or a triple gate structure in which 3 channel forming regions are formed are also acceptable.

The drain wiring 4405 of switching TFT 4402 is electrically connected to gate electrode 4407 of current control TFT 4406. Note that the current control TFT 4406 is formed by using the p-channel TFT 301 of FIG. 5. Accordingly the description of the p-channel TFT 301 of FIG. 5 may be referred to, regarding the description of the structure. Note that while the present embodiment uses a single gate structure, a double gate structure or a triple gate structure is also acceptable.

A first passivation film 4408 is disposed over the switching TFT 4402 and the current control TFT 4406, and a planarization film 4409 comprising resin is formed on top. It is very important to flatten by using the planarization film 4409, the step due to the TFTs. Since an EL layer formed later is extremely thin, there are cases in which defective luminescence is caused due to the existence of the step. Therefore, it is preferable to planarize before forming pixel electrode so as to form an EL layer on a planarized surface as possible.

The reference numeral 4410 denotes a pixel electrode (anode of EL element) comprising a transparent conductive film, and is electrically connected to the drain wiring 4411 of the current control TFT 4406. A compound of indium oxide and tin oxide, a compound of indium oxide and zinc oxide, zinc oxide, tin oxide or indium oxide can be used as the transparent conductive film. Further, said conductive transparent film that includes gallium may also be used.

An EL layer 4411 is formed on pixel electrode 4410. Note that while FIG. 21 shows only 1 pixel, EL layers corresponding to each colors of R (red), G (green) and B (blue) are each formed properly in the present embodiment. A small molecular type organic EL material is formed by evaporation in the present embodiment. In concrete, a laminate structure is formed from a copper phthalocyanine (CuPc) film of 20 nm thickness disposed as a hole injection layer, and tris-8-quinolinolate aluminum complex ($Alq_3$) film formed thereon into 70 nm thickness as a luminescent layer. A luminescent color may be controlled by adding fluorescent dye such as quinacridon, Perylene or DCM1 into $Alq_3$.

However, the above example is one example of the organic EL materials that can be used as an EL layer, and it is not necessary to limit to these materials. An EL layer (a layer for luminescence and for performing carrier motion for luminescence) may be formed by freely combining luminescence layer, charge transport layer, or charge injection layer. For example, an example using small molecular type materials as luminescence layers is shown in the present embodiment, but polymer type organic EL materials may also be used. Further, it is possible to use inorganic materials such as silicon carbide, etc., as charge transport, layer and charge injection layer. Publicly known materials can be used for these organic EL materials and inorganic materials.

A cathode 4412 comprising a conductive film is next formed on EL layer 4411. In the case of the present embodiment, an alloy film of aluminum and lithium is used as the conductive film. Needless to say, a publicly known MgAg film (alloy film of magnesium and silver) may also be used. As the cathode material, a conductive film comprising an element belonging to periodic table group 1 or 2, or a conductive film added with at least one of these elements, may be used.

EL element 4413 is completed at the point when this cathode 4412 is formed. Note that an EL element 4413 formed here represents a capacitor formed from pixel electrode (anode) 4410, EL layer 4411 and cathode 4412.

The top view of the pixel in the present embodiment is next described by using FIG. 22A. Source region of switching TFT 4402 is connected to source wiring 4415 and drain region is connected to drain wiring 4405. Further, drain wiring 4405 is electrically connected to the gate electrode 4407 of the current control TFT 4406. Source region of the current control TFT 4406 is electrically connected to the current supply line 4416 and the drain region is electrically connected to the drain wiring 4417. Drain wiring 4417 is electrically connected to pixel electrode (anode) 4410 shown by dotted line.

Here, a storage capacitor is formed in the region shown by 4419. Storage capacitor 4419 is formed from a semiconductor film 4420 electrically connected to current supply line 4416, an insulating film formed of the same layer as gate insulating film (not shown) and gate electrode 4407. Further, it is possible to use a capacitance formed from gate electrode 4407, a layer formed from the same layer as the first interlayer insulating film (not shown) and current supply line 4416, for a storage capacitor.

Embodiment 13

Figure 23:
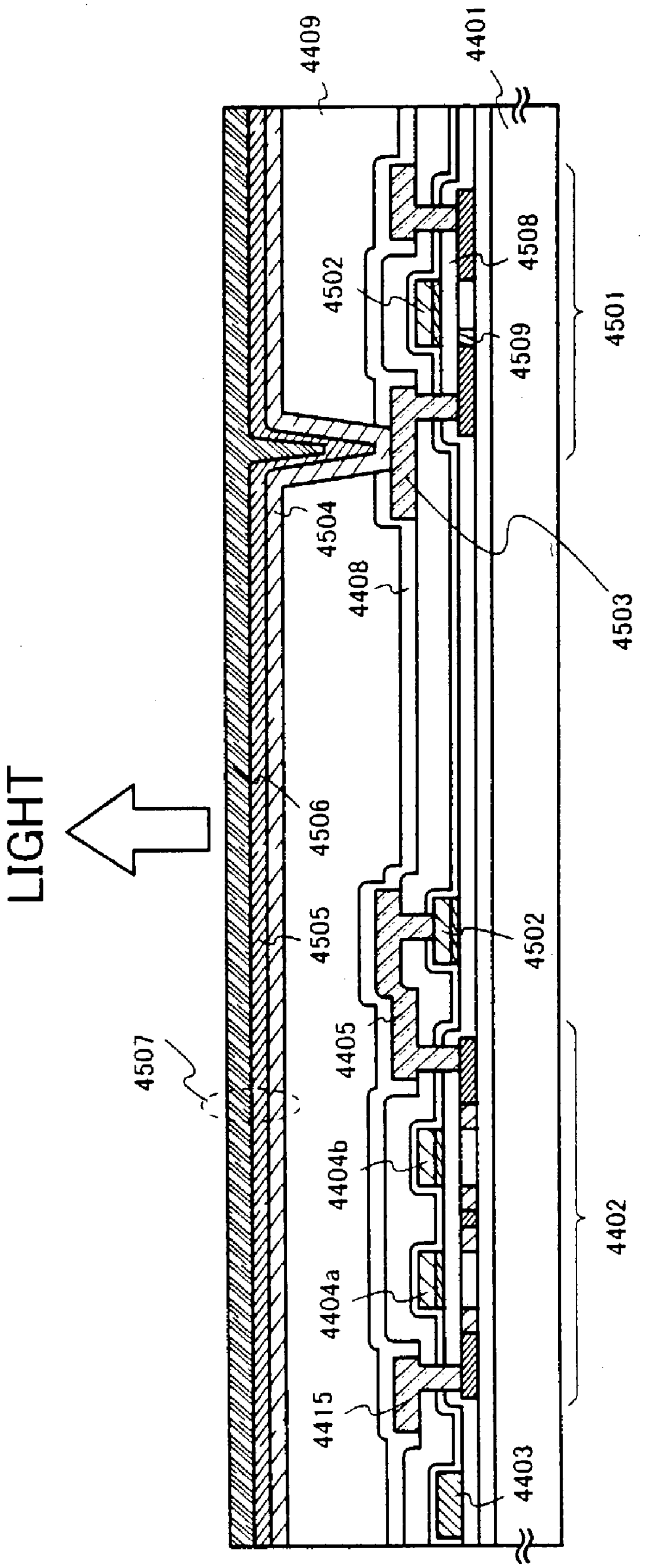
FIG. 23 is a sectional view showing the structure of the pixel of the active matrix type EL display.

In embodiment 13 an EL display device having a pixel structure differing from embodiment 12 is described. FIG. 23 is used for explanation. Note that the description of embodiment 12 may be referred to, regarding parts where the same reference numerals as FIG. 22 are given.

In FIG. 23 a TFT having the same structure as the n-channel TFT in FIG. 5 is used as a current control TFT 4501. Needless to say, gate electrode 4502 of current control TFT 4501 is electrically connected to drain wiring 4405 of switching TFT 4402. Drain wiring 4503 of current control TFT 4501 is electrically connected to pixel electrode 4504.

In embodiment 13, a pixel electrode 4504 comprising a conductive film functions as a cathode of the EL element. An alloy film of aluminum and lithium is used in concrete, but a conductive film comprising an element belonging to periodic table group 1 or 2, or a conductive film added with such element may be used here.

EL layer 4505 is formed on top of pixel electrode 4504. Note that though FIG. 23 shows only 1 pixel, EL layer corresponding to G (green) is formed in the present embodiment by evaporation method or coating method (preferably spin coating). In concrete, it is a laminate structure comprising a lithium fluoride (LiF) film of 20 nm thickness provided as electron injection layer and a PPV (poly-p-phenylene vinylene) of 70 nm thickness provided thereon as luminescence layer.

An anode 4506 comprising a transparent conductive film is next disposed on EL layer 4505. In the present embodiment, a compound of indium oxide and tin oxide or a compound of indium oxide and zinc oxide is used as the transparent conductive film.

On completing formation of anode 4506, an EL element 4507 is finished. Note that EL element 4507 represents here a capacitor formed from pixel electrode (cathode) 4504, EL layer 4505 and anode 4506.

Degradation due to hot carrier effect is actualized in a current control TFT 4501 in case that the voltage applied to the EL element is such a high voltage as exceeding 10V. It is effective to use an n-channel TFT that has a structure in accordance with the present invention as the current control TFT 4501.

Note that, the current control TFT 4501 of the present embodiment forms a parasitic capacitance, which is referred to as gate capacitance, in between gate electrode 4502 and LDD regions 4509. It is possible to provide the same function as storage capacitor 4418 shown in FIGS. 22A and 22B by adjusting this gate capacitance. Specifically in case of driving the EL display device by digital driving method, it is possible to use the gate capacitance for storage capacitor because the capacitance of storage capacitor can be smaller compared to the case of driving by analog driving method.

Note that an n-channel TFT in which LDD region 4509 is omitted from the structure shown in FIG. 23 may be used in case the voltage applied to an EL element is less than 10V preferably less than 5V because above stated degradation due to hot carrier effect would not become a serious problem.

Embodiment 14

Figure 24A:
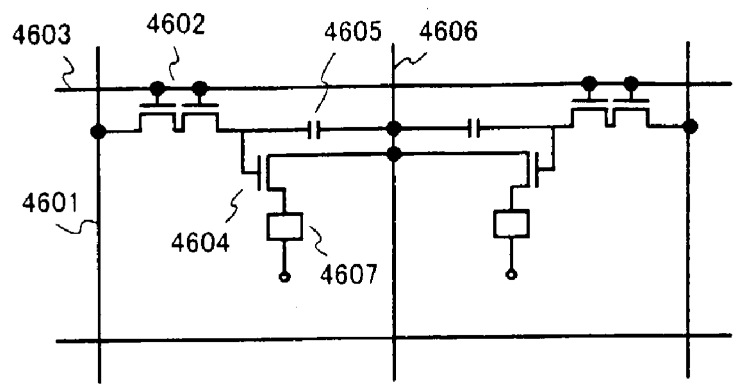
FIGS. 24(A) to 24(C) are circuit diagrams of the active matrix type EL display.
Figure 24B:
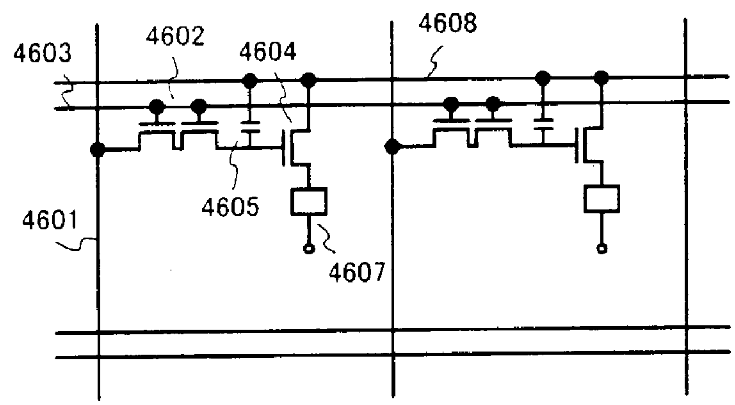
Figure 24C:
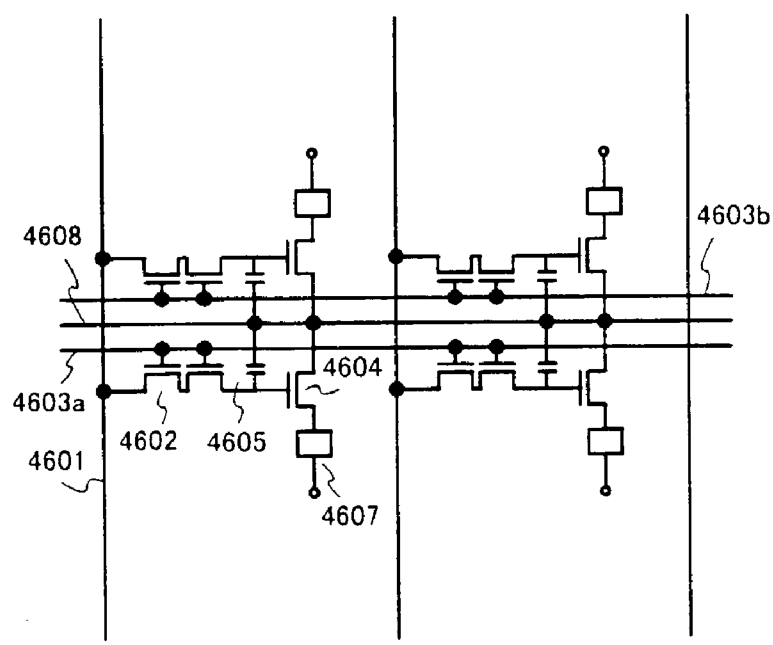

Examples of pixel structures that can be used in the pixel section of an EL display device described in Embodiments 12 and 13 are shown in the present Embodiment in FIGS. 24A to 24C. In the present Embodiment: reference numeral 4601 denotes a source wiring of a switching TFT 4602; 4603, a gate wiring of a switching TFT 4602; 4604, a current control TFT; 4605, a capacitance; 4606 and 4608, power supply lines; and 4607, EL element.

FIG. 24A shows an example in which the current supply line 4606 is shared by two pixels. In other words, this example is characterized in that two pixels are formed so as to be axisymmetric with respect to the current supply line 4606. In this case, the number of current supply lines can be reduced, further enhancing the definition of the pixel portion.

FIG. 24B shows an example in which the current supply line 4608 is arranged in parallel with the gate wirings 4603. Though the current supply line 4608 is arranged so as not to overlap with the gate wirings 4603 in FIG. 24B, the two may overlap with each other through an insulating film if the lines are formed in different layers. In this case, the current supply line 4608 and the gate wiring 4603 can share their occupying area, further enhancing the definition of the pixel portion.

An example shown in FIG. 24C is characterized in that the current supply line 4608 is arranged, similar to the structure in FIG. 24B, in parallel with the gate wirings 4603 and, further, two pixels are formed to be axisymmetric with respect to the current supply line 4608. It is also effective to arrange the current supply line 4608 so as to overlap with one of the gate wirings 4603. In this case, the number of current supply lines can be reduced, further enhancing the definition of the pixel portion.

Embodiment 15

Figure 25A:
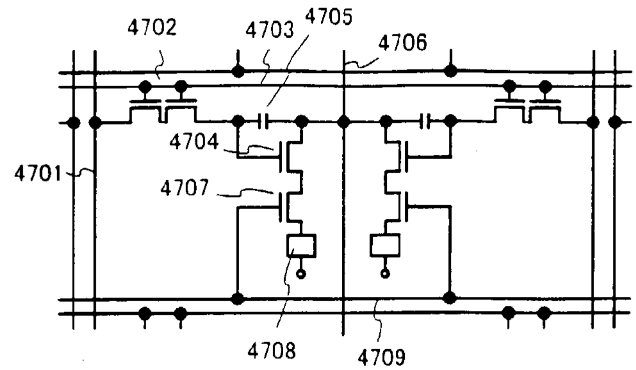
FIGS. 25(A) and 25(B) are circuit diagrams of the active matrix type EL display.
Figure 25B:
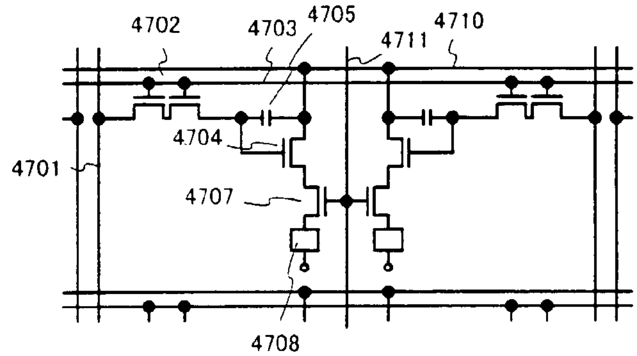

The present embodiment shows in FIGS. 25A and 25B examples of pixel structure in an EL display device implementing the present invention. In the present embodiment: reference numeral 4701 is a source wiring of a switching TFT 4702; 4703, gate wiring of the switching TFT 4702; 4704, current control TFT; 4705, a capacitor (it is possible to omit the capacitor); 4706, current supply line; 4707, power supply controlling TFT; 4708, gate wiring for controlling the power supply; and 4709, EL element. Japanese Patent Laid-Open Publication No. 341272 of 1999 may be referred to, regarding operation of the power supply controlling TFT 4707.

Further, though the present embodiment disposes the power supply controlling TFT 4707 between the current control TFT 4704 and the EL element 4708, a structure in which the current control TFT is disposed between the power supply control TFT 4707 and the EL element 4708 is also acceptable. Further, the power supply control TFT 4707 may be preferably formed by the same structure as the current control TFT 4704 or formed in series with the same active layer.

FIG. 25A shows an example of sharing the current supply line 4706 between 2 pixels. It is characterized in that 2 pixels are formed to be axisymmetric with respect to the current supply line 4706. In this case the pixel section is formed in higher precision because the number of current supply lines can be reduced.

FIG. 25B shows an example in a case of disposing the current supply line 4710 in parallel to the gate wiring 4703 and disposing the gate wiring for controlling power supply 4711 in parallel to the source wiring 4701. Note that though FIG. 25B shows a structure of disposing the current supply line 4710 and the gate wiring 4703 so as not to overlap, they can be disposed to overlap by interposing an insulating film if the two are wirings formed in different layers. The pixel section can be formed in higher precision in this case because the occupying area for the current supply line 4710 and the gate wiring 4703 are shared.

Embodiment 16

Figure 26A:
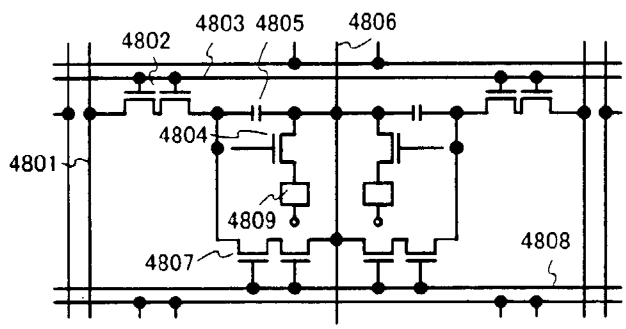
FIGS. 26(A) and 26(B) are circuit diagrams of the active matrix type EL display.
Figure 26B:
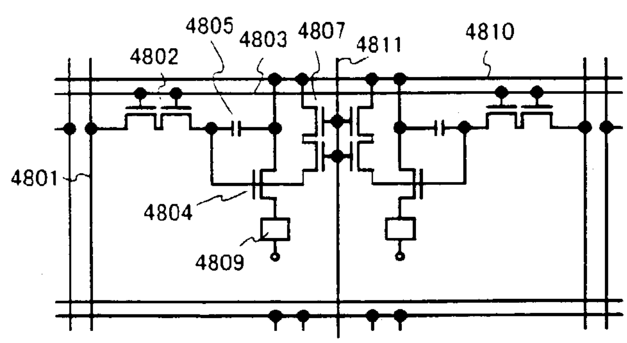

An example of the pixel structure of an EL display device implementing the present invention is shown in the present embodiment in FIGS. 26A and 26B. In the present embodiment: the reference numeral 4801 denotes a source wiring for a switching TFT 4802; 4803, a gate wiring for the switching TFT 4802; 4804, current control TFT; 4805, a capacitor (it is possible to omit the capacitor); 4806, a current supply line; 4807, an erasing TFT; 4808, an erasing gate wiring; and 4809, an EL element. Japanese Patent Laid-Open Publication No. 338786 of 1999 may be referred to, regarding the operation of the erasing TFT 4807.

The drain region of the erasing TFT 4807 is connected to the gate of the current control TFT 4804, and it is formed to be capable of compulsorily vary the gate voltage of the current control TFT 4804. Not that though the erasing TFT 4807 may be an n-channel TFT or a p-channel TFT, it is preferable that it is in the same structure as the switching TFT 4802 in order that the OFF current is reduced.

FIG. 26A is an example in a case of sharing the current supply line 4806 between 2 pixels. Namely it is characterized in that 2 pixels are formed in axisymmetric with respect to the current supply line 4806. In this case, the pixel section can be formed in higher precision because the number of the current supply lines can be reduced.

FIG. 26B is an example in a case of disposing the current supply line 4810 in parallel to the gate wiring 4803 and disposing the erasing gate wiring 4811 in parallel to the source wiring 4801. Note that though FIG. 26B shows a structure of disposing the current supply line 4810 and the gate wiring 4803 so as not to overlap, they can be disposed to overlap by interposing an insulating film if the two are wirings formed in different layers. The pixel section can be formed in higher precision in this case because the occupying area for the current supply line 4810 and the gate wiring 4803 are shared.

Embodiment 17

The above stated EL display device may be a structure of disposing several TFTs in the pixel. For example, 4, 6 or more TFTs may be disposed. It is possible to implement the present invention without limitation to the pixel structure of the EL display device.

Embodiment 18

CMOS circuits and pixel circuits formed by implementing the present invention could sufficiently reduce the parasitic capacitance even when the aperture ratio was increased by overlapping the gate wiring and the second wiring. Accordingly it is specifically more effective if they are used in an active matrix liquid crystal display device of diagonal 1 inch or less.

Figure 27:
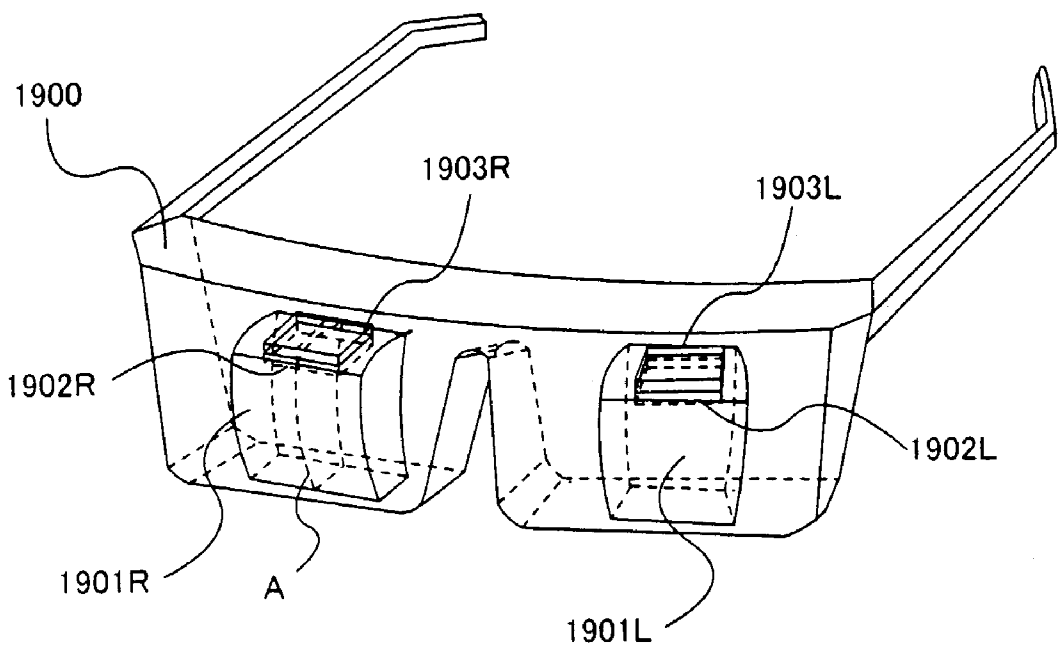
FIG. 27 depicts an example of a goggle type display.

As an example of such electronic device, a goggle type display device (head-mounted display) is given. FIG. 27 is referred. A diagram of outlined structure of the goggle type display device in the present embodiment is shown in FIG. 27. Reference numeral 1900 is a main body of the goggle type display device; 1901R and 1901L, lenses; 1902R and 1902L, liquid crystal panels; 1903R and 1903L, back lights.

The present invention can be applied to the liquid crystal panel 1902R. 1902L and other driver circuits.

The constitution of this embodiment can be freely combined with any one of Embodiments 1 to 11.

Embodiment 19

CMOS circuits and pixel section formed in accordance with the present invention can be used in various electrooptical devices (active matrix type liquid crystal display, active matrix type EL display, active matrix type EC (electro chromic) display). In other words, the present invention can be applied to all of the electronic devices having these electrooptical devices as the display section.

The following can be given as examples of this type of electronic devices: large sized TVs, video cameras, digital cameras, wearable displays, car navigation systems, personal computers, and portable information terminals (mobile computers, portable telephones or electronic books etc.). Some examples of these are shown in FIGS. 28A to 28E and 30A to 30C.

Figure 28A:
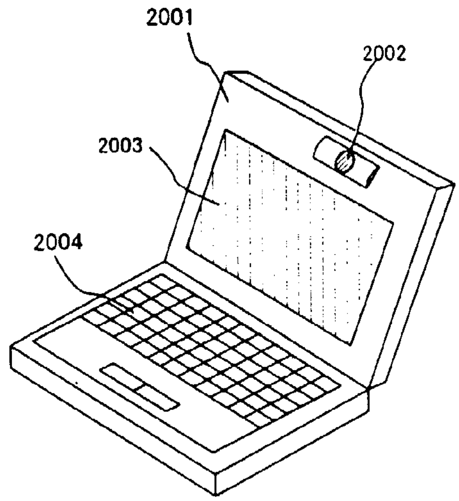
FIGS. 28(A) to 28(E) depict examples of electronic equipment.

FIG. 28A is a personal computer which comprises: a main body 2001; an image input section 2002; a display section 2003; and a keyboard 2004. The present invention can be applied to the image input section 2002, the display section 2003 and other driver circuits.

Figure 28B:
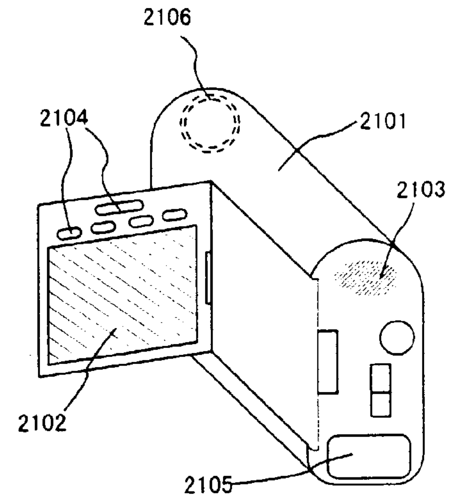

FIG. 28B is a video camera, which comprises: a main body 2101; a display section 2102; a voice-input section 2103; operation switches 2104; a battery 2105; and an image receiving section 2106. The present invention can be applied to the display section 2102, the voice input section 2103 and other driver circuits.

Figure 28C:
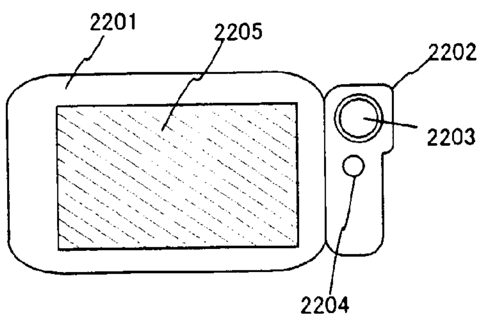

FIG. 28C is a mobile computer which comprises: a main body 2201; a camera section 2202; an image receiving section 2203; operation switches 2204; and a display section 2205. The present invention can be applied to the display section 2205 and other driver circuits.

Figure 28D:
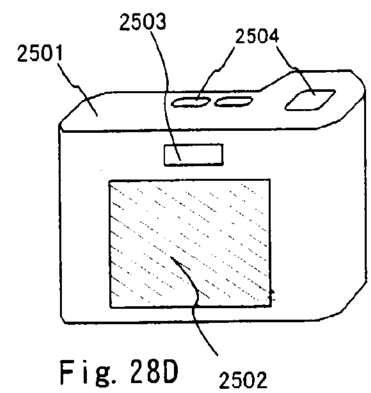

FIG. 28D is a digital camera which comprises: a main body 2501; a display section 2502; a view finder section 2503; operation switches 2504; and an image receiving section (not shown in the figure). The present invention can be applied to the display section 2502 and other driver circuits.

Figure 28E:
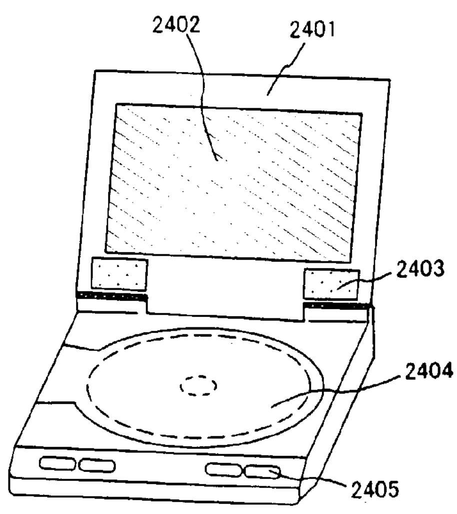

FIG. 28E is a player that uses a recording medium on which a program is recorded (hereinafter referred to as a recording medium), which comprises: a main body 2401, a display section 2402, a speaker section 2403, a recording medium 2404, and operation switches 2405. Note that music appreciation, film appreciation, games, and the use of the Internet can be performed with this device using a DVD (digital versatile disk), a CD, etc., as a recording medium. The present invention can be applied to the display section 2402 and other driver circuits.

Figure 30A:
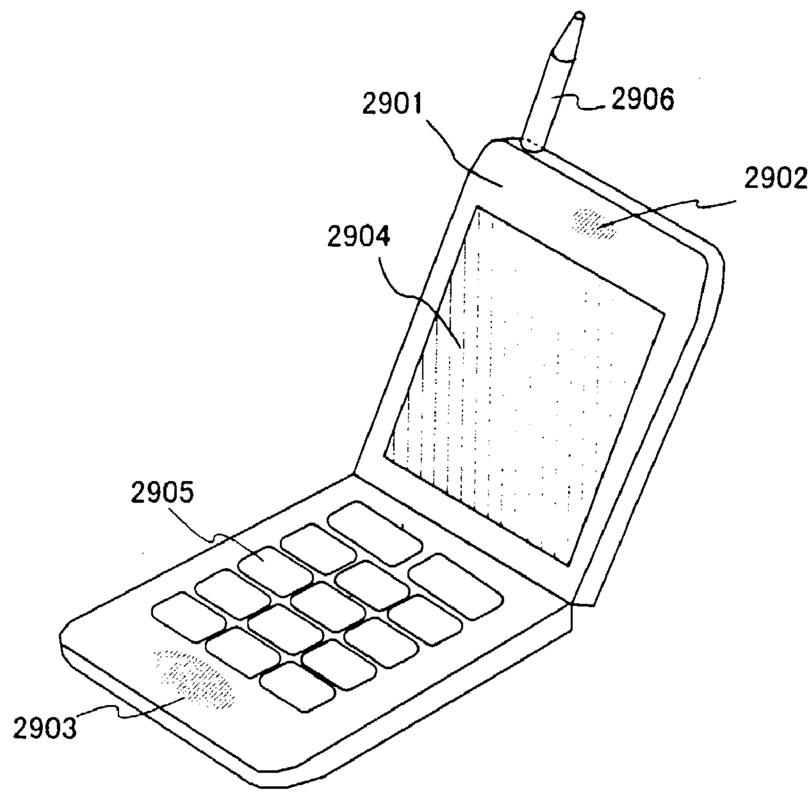
FIGS. 30(A) to 30(C) depict examples of electronic equipment.

FIG. 30A is a portable telephone which comprises: a main body 2901; a voice output section 2902; a voice input section 2903; a display section 2904; operation switches 2905; and an antenna 2906, etc. The present invention can be applied to the voice output section 2902, to the voice input section 2903, to the display section 2904, and to other signal control circuits.

Figure 30B:
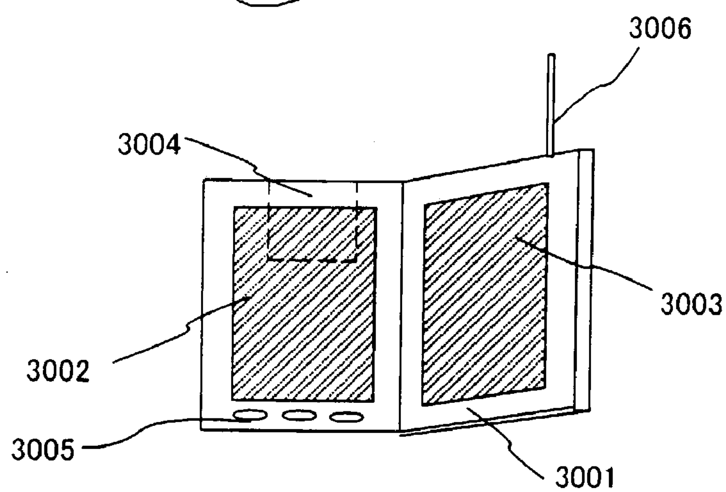

FIG. 30B is a portable book (electronic book), which comprises: a main body 3001; display sections 3002 and 3003; a recording medium 3004; operation switches 3005; and an antenna 3006, etc. The present invention can be applied to the display sections 3002 and 3003 and to other signal control circuits.

Figure 30C:
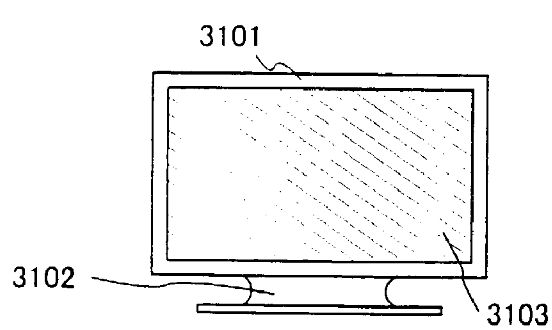

FIG. 30C is a display which comprises: a main body 3101; supporting section 3102; and a display section 3103, etc. The present invention can be applied to the display section 3103. The display of the present invention is specifically advantageous in large sized display, and it is advantageous in a display over diagonal 10 inch (specifically over 30 inch).

As described above, the applicable range of the liquid crystal display device of the present invention is very large, and it is possible to apply to electronic devices of various areas. The electronic devices of the present invention can be realized by using any combination of the constitutions of Embodiments 1 to 18.

Embodiment 20

Liquid crystal display formed in accordance with the present invention can be used in projectors (rear type or front type).

Figure 29A:
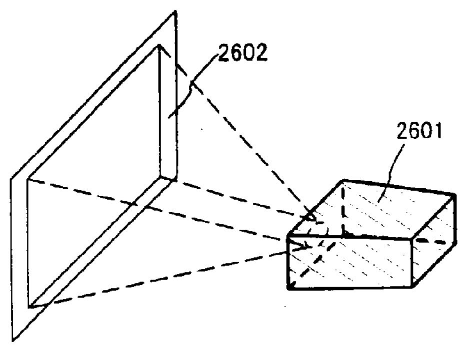
FIGS. 29(A) to 29(D) depict examples of electronic equipment.

FIG. 29A is a front type projector that comprises a display section 2601 and a screen 2602. The present invention can be applied to the display section and other driver circuits.

Figure 29B:
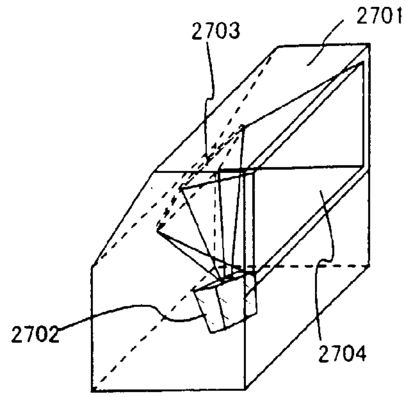

FIG. 29B is a rear type projector that comprises a main body 2701, a display section 2702, a mirror 2703, and a screen 2704. The present invention can be applied to the display section and other driver circuits.

Figure 29C:
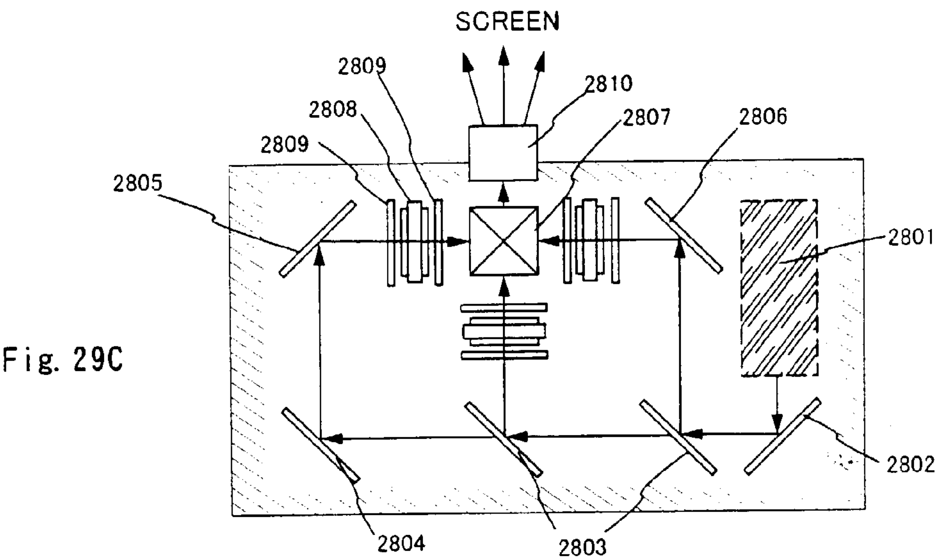

Note that FIG. 29C is a diagram showing an example of the structure of the display sections 2601 and 2702 in FIGS. 29A and 29B. The display sections 2601 and 2702 comprise: an optical light source system 2801; mirrors 2802 and 2804 to 2806; a dichroic mirror 2803; a prism; a liquid crystal display device 2808; a phase differentiating plate 2809; and a projection optical system 2810. The projection optical system 2810 comprises a optical system including a projection lens. Though a 3-plate type is shown as an example in the present embodiment, the structure is not limited to this type, and a single-plate type is acceptable for example. Further, an operator may appropriately dispose an optical lens, a film having a polarizing function, a film for adjusting the phase difference, or IR film etc., in the light path shown by an arrow in FIG. 29C.

Figure 29D:
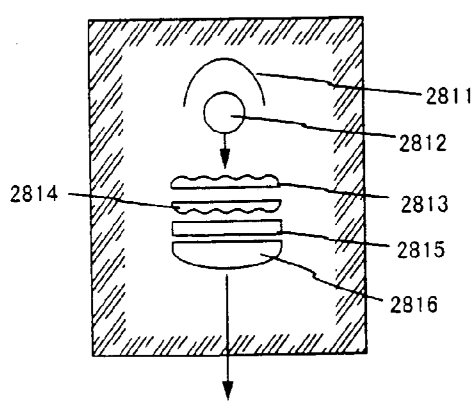

FIG. 29D is a diagram showing an example of the structure of the optical light source system 2801 in FIG. 29C. The optical light source system 2801 comprises: a reflector 2811, a light source 2812, lens arrays 2813 and 2814, light polarizing conversion element 2815 and a condenser lens 2816. Note that the optical light source system shown in FIG. 29D is merely an example and the structure is not limited to this structure. For example, an operator may appropriately dispose an optical lens, a film having a polarizing function, a film for adjusting the phase difference, or IR film etc., in the optical light source system.

The electronic, devices of the present invention can be realized by using any combination of the constitutions of Embodiments 1 to 9 or Embodiment 11.

TABLE 1

Interlayer Insulating Film Theoretical Value of p-Si Film Loss Amount in Forming Contact Hole

| Variation in SiO2 Etching Rate (± %) | SELECTIVITY (SiO2/p-Si) 5 | 10 | 15 | 20 | 25 | 30 | 35 | 40 | 45 | 50 |
|---|---|---|---|---|---|---|---|---|---|---|
| 1 | 7.8 | 3.9 | 2.6 | 1.9 | 1.6 | 1.3 | 1.1 | 1.0 | 0.9 | 0.8 |
| 2 | 9.1 | 4.6 | 3.0 | 2.3 | 1.8 | 1.5 | 1.3 | 1.1 | 1.0 | 0.9 |
| 3 | 10.6 | 5.3 | 3.5 | 2.6 | 2.1 | 1.8 | 1.5 | 1.3 | 1.2 | 1.1 |
| 4 | 12.0 | 6.0 | 4.0 | 3.0 | 2.4 | 2.0 | 1.7 | 1.5 | 1.3 | 1.2 |
| 5 | 13.5 | 6.7 | 4.5 | 3.4 | 2.7 | 2.2 | 1.9 | 1.7 | 1.5 | 1.3 |
| 6 | 15.0 | 7.5 | 5.0 | 3.7 | 3.0 | 2.5 | 2.1 | 1.9 | 1.7 | 1.5 |
| 7 | 16.5 | 8.3 | 5.5 | 4.1 | 3.3 | 2.8 | 2.4 | 2.1 | 1.8 | 1.7 |
| 8 | 18.1 | 9.0 | 6.0 | 4.5 | 3.6 | 3.0 | 2.6 | 2.3 | 2.0 | 1.8 |
| 9 | 19.7 | 9.8 | 6.6 | 4.9 | 3.9 | 3.3 | 2.8 | 2.5 | 2.2 | 2.0 |
| 10 | 21.3 | 10.7 | 7.1 | 5.3 | 4.3 | 3.6 | 3.0 | 2.7 | 2.4 | 2.1 |
| 11 | 23.0 | 11.5 | 7.7 | 5.8 | 4.6 | 3.8 | 3.3 | 2.9 | 2.6 | 2.3 |
| 12 | 24.7 | 12.4 | 8.2 | 6.2 | 4.9 | 4.1 | 3.5 | 3.1 | 2.7 | 2.5 |
| 13 | 26.5 | 13.2 | 8.8 | 6.6 | 5.3 | 4.4 | 3.8 | 3.3 | 2.9 | 2.6 |
| 14 | 28.3 | 14.1 | 9.4 | 7.1 | 5.7 | 4.7 | 4.0 | 3.5 | 3.1 | 2.8 |
| 15 | 30.1 | 15.1 | 10.0 | 7.5 | 6.0 | 5.0 | 4.3 | 3.8 | 3.3 | 3.0 |

Condition:
Interlayer Insulating Film (200 nm ± 5%) + Gate Insulating Film (120 nm ± 5%)
Min: 190 nm + 114 nm = 304 nm
Max: 210 nm + 126 nm = 336 nm
Average of SiO2 Etching Rate = 300 nm/min (5 nm/sec)
Over Etching Time = 0 sec.

What is claimed is:

1. A method of manufacturing a semiconductor device including at least one TFT on an insulating surface, said method comprising:

forming an active layer on the insulating surface;

forming a gate insulating film on said active layer;

introducing an n-type impurity element or a p-type impurity element into a portion of said active layer, thereby forming a source region or a drain region;

forming a first interlayer insulating film over a gate wiring and a gate electrode;

forming a second interlayer insulating film on said first interlayer insulating film;

etching said second interlayer insulating film, thereby eliminating said second interlayer insulating film disposed over said source region or said drain region;

etching said first interlayer insulating film and said gate insulating film, thereby forming a contact hole that reaches said source region or said drain region; and forming a wiring in contact with said source region or said drain region, said wiring disposed on said second interlayer insulating film that overlaps with said gate electrode.

2. A method of manufacturing a semiconductor device according to claim 1, wherein said first interlayer insulating film comprises at least one selected from the group consisting of silicon oxide, silicon nitride and silicon nitride oxide.

3. A method of manufacturing a semiconductor device according to claim 1, wherein said second interlayer insulating film comprises at least one selected from the group consisting of silicon oxide, silicon nitride and silicon nitride oxide.

4. A method of manufacturing a semiconductor device according to claim 1, wherein said first interlayer insulating film has a thickness of 200 nm or less.

5. A method of manufacturing a semiconductor device according to claim 1, wherein said second interlayer insulating film has a thickness of more than 0.5 $\mu$m.

6. A method of manufacturing a semiconductor device according to claim 1, wherein said semiconductor device is a liquid crystal display device or an EL display device.

7. A method of manufacturing a semiconductor device according to claim 1, wherein said semiconductor device is at least one selected from the group consisting of a personal computer, a video camera, a digital camera, a mobile computer, a player that uses a recording medium, a portable telephone, and an electronic book.

8. A method of manufacturing a semiconductor device including at least a pixel circuit and driving circuit for controlling said pixel circuit, each disposed on a same substrate, said method comprising:

forming an active layer on an insulating surface;

forming a gate insulating film on said active layer;

forming a gate wiring and a gate electrode on said gate insulating film;

adding an n-type impurity element or a p-type impurity element to a part of said active layer, thereby forming an n-type impurity region or a p-type impurity region;

forming a first interlayer insulating film over said gate wiring and said gate electrode;

selectively forming a second interlayer insulating film on said first interlayer insulating film that overlaps with said gate electrode;

etching said first interlayer insulating film and said gate insulating film, thereby forming a contact hole that reaches said n-type impurity region or said p-type impurity region; and forming a wiring in contact with said n-type impurity region or said p-type impurity region, said wiring disposed on said second interlayer insulating film that overlaps with said gate electrode.

9. A method of manufacturing a semiconductor device according to claim 8, wherein said first interlayer insulating film comprises at least one selected from the group consisting of silicon oxide, silicon nitride and silicon nitride oxide.

10. A method of manufacturing a semiconductor device according to claim 8, wherein said second interlayer insulating film comprises at least one selected from the group consisting of silicon oxide, silicon nitride and silicon nitride oxide.

11. A method of manufacturing a semiconductor device according to claim 8, wherein said first interlayer insulating film has a thickness of 200 nm or less.

12. A method of manufacturing a semiconductor device according to claim 8, wherein said second interlayer insulating film has a thickness of more than 0.5 $\mu$m.

13. A method of manufacturing a semiconductor device according to claim 8, wherein said semiconductor device is a liquid crystal display device or an EL display device.

14. A method of manufacturing a semiconductor device according to claim 8, wherein said semiconductor device is at least one selected from the group consisting of a personal computer, a video camera, a digital camera, a mobile computer, a player that uses a recording medium, a portable telephone, and an electronic book.

15. A method of manufacturing a semiconductor device including at least a pixel circuit and driving circuit for controlling said pixel circuit, each disposed on a same substrate, said method comprising:

forming an active layer on an insulating surface;

forming a gate insulating film on said active layer;

forming a gate wiring and a gate electrode on said gate insulating film;

introducing an n-type impurity element or a p-type impurity element into a portion of said active layer, thereby forming an n-type impurity region or a p-type impurity region;

forming a first interlayer insulating film over said gate wiring and said gate electrode;

etching said first interlayer insulating film and said gate insulating film, thereby forming a contact hole that reaches said n-type impurity region or said p-type impurity region;

selectively forming a second interlayer insulating film on said first interlayer insulating film; and forming a wiring in contact with said n-type impurity region or said p-type impurity region, said wiring disposed on said second interlayer insulating film that overlaps with said gate electrode.

16. A method of manufacturing a semiconductor device according to claim 15, wherein said first interlayer insulating film comprises at least one selected from the group consisting of silicon oxide, silicon nitride and silicon nitride oxide.

17. A method of manufacturing a semiconductor device according to claim 15, wherein said second interlayer insulating film comprises at least one selected from the group consisting of silicon oxide, silicon nitride and silicon nitride oxide.

18. A method of manufacturing a semiconductor device according to claim 15, wherein said first interlayer insulating film has a thickness of 200 nm or less.

19. A method of manufacturing a semiconductor device according to claim 15, wherein said second interlayer insulating film has a thickness of more than 0.5 $\mu$m.

20. A method of manufacturing a semiconductor device according to claim 15, wherein said semiconductor device is a liquid crystal display device or an EL display device.

21. A method of manufacturing a semiconductor device according to claim 15, wherein said semiconductor device is at least one selected from the group consisting of a personal computer, a video camera, a digital camera, a mobile computer, a player that uses a recording medium, a portable telephone, and an electronic book.

22. A method of manufacturing a semiconductor device comprising:

forming a thin film transistor over a substrate, the thin film transistor comprising an active layer and a gate electrode with a gate insulating film interposed therebetween;

forming a first interlayer insulating film over the gate electrode;

forming a second interlayer insulating film on said first interlayer insulating film;

etching said second interlayer insulating film;

etching said first interlayer insulating film and said gate insulating film to form a contact hole that reaches said active layer;

forming a wiring in contact with said active layer, wherein said wiring is formed on said second interlayer insulating film, and wherein said wiring overlaps with said gate electrode;

forming a third interlayer insulating film over the wiring; and forming a pixel electrode in contact with the wiring, wherein said pixel electrode is formed on the third interlayer insulating film.

23. A method of manufacturing a semiconductor device according to claim 22, wherein said gate electrode is formed over said active layer.

24. A method of manufacturing a semiconductor device according to claim 22, wherein said first interlayer insulating film comprises at least one selected from the group consisting of silicon oxide, silicon nitride and silicon nitride oxide.

25. A method of manufacturing a semiconductor device according to claim 22, wherein said second interlayer insulating film comprises at least one selected from the group consisting of silicon oxide, silicon nitride and silicon nitride oxide.

26. A method of manufacturing a semiconductor device according to claim 22, wherein said first interlayer insulating film has a thickness of 200 nm or less.

27. A method of manufacturing a semiconductor device according to claim 22, wherein said second interlayer insulating film has a thickness of more than 0.5 $\mu$m.

28. A method of manufacturing a semiconductor device according to claim 22, wherein said semiconductor device is a liquid crystal display device or an EL display device.

29. A method of manufacturing a semiconductor device according to claim 22, wherein said semiconductor device is at least one selected from the group consisting of a personal computer, a video camera, a digital camera, a mobile computer, a player that uses a recording medium, a portable telephone, and an electronic book.

30. A method of manufacturing a semiconductor device according to claim 22, wherein said third interlayer insulating film comprises a resin selected from the group consisting of polyimide, acrylic resin, polyamide, polyimide amid, and BCB (benzocyclobutene).

31. A method of manufacturing a semiconductor device according to claim 22, wherein said pixel electrode comprises indium tin oxide.

32. A method of manufacturing a semiconductor device comprising:

forming a thin film transistor over a substrate, the thin film transistor comprising an active layer and a gate electrode with a gate insulating film interposed therebetween;

forming a first interlayer insulating film over the gate electrode;

selectively forming a second interlayer insulating film on said first interlayer insulating film, wherein said second interlayer insulating film overlaps with said gate electrode;

etching said first interlayer insulating film and said gate insulating film to form a contact hole that reaches said active layer;

forming a wiring in contact with said active layer, wherein said wiring is formed on said second interlayer insulating film, and wherein said wiring overlaps with said gate electrode;

forming a third interlayer insulating film over the wiring; and forming a pixel electrode in contact with the wiring, wherein said pixel electrode is formed on the third interlayer insulating film.

33. A method of manufacturing a semiconductor device according to claim 32, wherein said gate electrode is formed over said active layer.

34. A method of manufacturing a semiconductor device according to claim 32, wherein said first interlayer insulating film comprises at least one selected from the group consisting of silicon oxide, silicon nitride and silicon nitride oxide.

35. A method of manufacturing a semiconductor device according to claim 32, wherein said second interlayer insulating film comprises at least one selected from the group consisting of silicon oxide, silicon nitride and silicon nitride oxide.

36. A method of manufacturing a semiconductor device according to claim 32, wherein said first interlayer insulating film has a thickness of 200 nm or less.

37. A method of manufacturing a semiconductor device according to claim 32, wherein said second interlayer insulating film has a thickness of more than 0.5 $\mu$m.

38. A method of manufacturing a semiconductor device according to claim 32, wherein said semiconductor device is a liquid crystal display device or an EL display device.

39. A method of manufacturing a semiconductor device according to claim 32, wherein said semiconductor device is at least one selected from the group consisting of a personal computer, a video camera, a digital camera, a mobile computer, a player that uses a recording medium, a portable telephone, and an electronic book.

40. A method of manufacturing a semiconductor device according to claim 32, wherein said third interlayer insulating film comprises a resin selected from the group consisting of polyimide, acrylic resin, polyamide, polyimide amid, and BCB (benzocyclobutene).

41. A method of manufacturing a semiconductor device according to claim 32, wherein said pixel electrode comprises indium tin oxide.

42. A method of manufacturing a semiconductor device comprising: forming a thin film transistor over a substrate, the thin film transistor comprising an active layer and a gate electrode with a gate insulating film interposed therebetween;

forming a first interlayer insulating film over the gate electrode;

etching said first interlayer insulating film and said gate insulating film to form a contact hole that reaches said active layer;

selectively forming a second interlayer insulating film on said first interlayer insulating film;

forming a wiring in contact with said active layer, wherein said wiring is formed on said second interlayer insulating film, and wherein said wiring overlaps with said gate electrode;

forming a third interlaver insulating film over the wiring; and forming a pixel electrode in contact with the wiring, wherein said pixel electrode is formed on the third interlayer insulating film.

43. A method of manufacturing a semiconductor device according to claim 42, wherein said gate electrode is formed over said active layer.

44. A method of manufacturing a semiconductor device according to claim 42, wherein said first interlayer insulating film comprises at least one selected from the group consisting of silicon oxide, silicon nitride and silicon nitride oxide.

45. A method of manufacturing a semiconductor device according to claim 42, wherein said second interlayer insulating film comprises at least one selected from the group consisting of silicon oxide, silicon nitride and silicon nitride oxide.

46. A method of manufacturing a semiconductor device according to claim 42, wherein said first interlayer insulating film has a thickness of 200 nm or less.

47. A method of manufacturing a semiconductor device according to claim 42, wherein said second interlayer insulating film has a thickness of more than 0.5 $\mu$m.

48. A method of manufacturing a semiconductor device according to claim 42, wherein said semiconductor device is a liquid crystal display device or an EL display device.

49. A method of manufacturing a semiconductor device according to claim 42, wherein said semiconductor device is at least one selected from the group consisting of a personal computer, a video camera, a digital camera, a mobile computer, a player that uses a recording medium, a portable telephone, and an electronic book.

50. A method of manufacturing a semiconductor device according to claim 42, wherein said third interlayer insulating film comprises a resin selected from the group consisting of polyimide, acrylic resin, polyamide, polyimide amid, and BCB (benzocyclobutene).

51. A method of manufacturing a semiconductor device according to claim 42, wherein said pixel electrode comprises indium tin oxide.

* * * * *